(12) United States Patent
Lanzillo et al.

(10) Patent No.: US 12,713,900 B2
(45) Date of Patent: Aug. 18, 2026

(54) FLY-OVER METAL JUMPER CONNECTION

(71) Applicant: INTERNATIONAL BUSINESS MACHINES CORPORATION, Armonk, NY (US)

(72) Inventors: Nicholas Anthony Lanzillo, Wynantskill, NY (US); Ruilong Xie, Niskayuna, NY (US); Brent A. Anderson, Jericho, VT (US); Albert M. Chu, Nashua, NH (US); Reinaldo Vega, Mahopac, NY (US); Lawrence A. Clevenger, Saratoga Springs, NY (US)

(73) Assignee: International Business Machines Corporation, Armonk, NY (US)

( * ) Notice: Subject to any disclaimer, the term of this patent is extended or adjusted under 35 U.S.C. 154(b) by 365 days.

(21) Appl. No.: 18/530,993

(22) Filed: Dec. 6, 2023

(65) Prior Publication Data

US 2025/0192023 A1 Jun. 12, 2025

(51) Int. Cl.
*H10W 20/43* (2026.01)
*H10W 20/00* (2026.01)
*H10W 20/42* (2026.01)

(52) U.S. Cl.
CPC ....... *H10W 20/432* (2026.01); *H10W 20/056* (2026.01); *H10W 20/063* (2026.01); *H10W 20/081* (2026.01); *H10W 20/42* (2026.01)

(58) Field of Classification Search
CPC ............................ H10W 20/42; H10W 20/432
See application file for complete search history.

(56) References Cited

U.S. PATENT DOCUMENTS

| | | | | |
|---|---|---|---|---|
| 10,157,774 B1 | 12/2018 | Peters | | |
| 10,163,495 B2 | 12/2018 | Liaw | | |
| 10,163,879 B2 | 12/2018 | Jung | | |
| 10,319,668 B2 | 6/2019 | Do | | |
| 11,114,153 B2 | 9/2021 | Chang | | |
| 11,335,682 B2 | 5/2022 | Choi | | |
| 2021/0202384 A1 | 7/2021 | Peng | | |
| 2023/0143562 A1 | 5/2023 | Jungho | | |
| 2023/0326848 A1* | 10/2023 | Lee | ........................ | H10W 20/42 |
| 2023/0335486 A1* | 10/2023 | Yang | .................... | H10W 20/056 |
| 2023/0369111 A1* | 11/2023 | Choi | .................... | H10W 20/077 |
| 2024/0186177 A1* | 6/2024 | Lanzillo | .............. | H10W 20/089 |

FOREIGN PATENT DOCUMENTS

EP 3671821 A1 6/2020

* cited by examiner

*Primary Examiner* — Steven M Page
(74) *Attorney, Agent, or Firm* — Seed Intellectual Property Law Group LLP

(57) ABSTRACT

An interconnect device has a first layer with a first metal line, a second metal line, and a third metal line, a second layer with a metal jumper and a metal via. The metal jumper is electrically connected to the first metal line and the second metal line. The metal via is electrically connected to the second metal line, and the metal jumper and the metal via are electrically isolated. The interconnect device further includes a third layer with a fourth metal line. The metal jumper is electrically isolated from the third metal line by a first dielectric region between the metal jumper and the third metal line.

7 Claims, 19 Drawing Sheets

FLY-OVER METAL JUMPER CONNECTION

BACKGROUND

Aspects of the present disclosure relate to semiconductors, and more specifically, to techniques for forming interconnect structures.

Semiconductor devices can include a plurality of circuits which form an integrated circuit fabricated on a substrate. A complex network of signal paths can be routed to connect the circuit elements distributed on the surface of the substrate. Efficient routing of these signals can include the formation of multilevel or multilayered schemes (e.g., single or dual damascene wiring structures) during the back-end-of-line (BEOL) phase of manufacturing. For example, semiconductor devices can rely on a plurality of metallization layers or metal lines stacked on top of one another on the semiconductor substrate to provide electronic interconnections between integrated circuits on the substrate. A metallization layer may also be referred to as a BEOL metallization layer which could be disposed on a semiconductor material stack. Semiconductor contacts in a top layer in the semiconductor material stack are electrically connected to metal contacts and metal interconnects in a metallization layer disposed on the semiconductor material stack.

BRIEF SUMMARY

The present disclosure provides a method, computer program product, and system for a fly-over metal jumper connection. In some embodiments, an interconnect structure comprises a first layer with a first metal line, a second metal line, and a third metal line, a second layer with a metal jumper and a metal via, wherein the metal jumper is electrically connected to the first metal line and the second metal line, wherein the metal via is electrically connected to the second metal line, and wherein the metal jumper and the metal via are electrically isolated, and a third layer with a fourth metal line above the jumper and the via, wherein the metal jumper is electrically isolated from the third metal line by a first dielectric region between the metal jumper and the third metal line.

Some embodiments of the present disclosure can also be illustrated by a method comprising depositing a metal jumper in a first recess over a first metal line and a second metal line, depositing a metal via in a second recess over a third metal line, wherein the metal jumper fills only a bottom portion of a first recess, and wherein the metal via completely fills the second recess, and depositing a dielectric material over the metal jumper to fill the first recess above the metal jumper.

Some embodiments of the present disclosure can also be illustrated by a method comprising forming a first layer of an interconnect structure by depositing a first metal line, a second metal line, and a third metal line surrounded by a first dielectric material, forming a second layer of an interconnect structure comprising a second dielectric material with a metal jumper recess and a metal via recess, depositing a conformational dielectric material on top of the second layer such that the metal via recess is filled with the conformational dielectric material, removing a portion of the conformational dielectric material from the top of the second layer such that the conformational dielectric material remains in the metal via recess, depositing a metal jumper in the metal jumper recess, removing a top portion of the metal jumper, depositing a dielectric material over a remaining bottom portion of the metal jumper, removing the conformational dielectric material from the metal via recess, and depositing a metal via in the metal via recess.

DETAILED DESCRIPTION

Figure 1A:
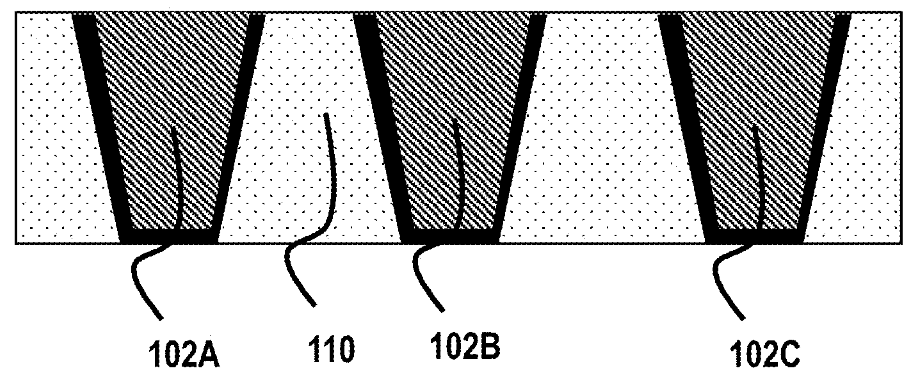
FIGS. 1A, 1B, 1C, 1D, 1E, and 1F illustrate an example interconnect structure in various stages of processing, according to various embodiments of the present disclosure.

Aspects of the present disclosure relate to semiconductor devices, and more particularly to fly-over metal jumper connections. However, it is to be understood that embodiments of the present disclosure are not limited to the illustrative methods, apparatus, systems and devices but instead are more broadly applicable to other suitable methods, apparatus, systems and devices.

In some embodiments, an interconnect structure comprises, a first layer with a first metal line, a second metal line, and a third metal line, a second layer with a metal jumper and a metal via, wherein the metal jumper is electrically connected to the first metal line and the second metal line, wherein the metal via is electrically connected to the second metal line, and wherein the metal jumper and the metal via are electrically isolated, and a third layer with a fourth metal line above the jumper and the via, wherein the metal jumper is electrically isolated from the third metal line by a first dielectric region between the metal jumper and the third metal line. The described interconnect structure provides the technical advantage over prior technology of having a metal line fabricated over a jumper without electrically connecting to the jumper. This advantage enables denser integrated circuit components.

In some embodiments, the interconnect structure above, where the metal jumper is formed in a lower portion of a first recess, and where a semiconductor material physically isolates the metal jumper from the second metal layer. The described interconnect structure provides the technical advantage over prior technology of having a metal line fabricated over a jumper without electrically connecting to the jumper by creating a thinner jumper and depositing dielectric over the jumper.

In some embodiments, the interconnect structure above, where the jumper extends below the top of the first metal line and the second metal line. The described interconnect structure provides the technical advantage over prior technology of providing an increased connection area between two lines and the jumper that connects the two lines.

In some embodiments, the interconnect structure above, where the metal jumper and the metal via are formed in the deposition process, and where the metal jumper is partially etched away. The described interconnect structure provides the technical advantage over prior technology of a jumper that is fabricated with an insulating dielectric over the jumper, allowing for a metal line to be deposited over the jumper without a short between the jumper and the metal line.

In some embodiments, the interconnect structure above where the metal jumper and the metal via are formed using a block mask deposition process. The described interconnect structure provides the technical advantage over prior technology of allowing for a metal line to be deposited over the jumper without a short between the jumper and the metal line.

In some embodiments, the interconnect structure above, where the metal jumper is formed after a sacrificial dielectric deposition layer fills a metal via recess. The described interconnect structure provides the technical advantage over prior technology of allowing for a metal line to be deposited over the jumper without a short between the jumper and the metal line.

In some embodiments, the interconnect structure above, where the metal via is deposited with a process selected from a group consisting of single damascene and dual damascene. The described interconnect structure provides the technical advantage over prior technology of allowing for a metal line connected to a via to be deposited over the jumper without a short between the jumper and the metal line.

In some embodiments, a method of fabricating an interconnect structure may comprise depositing a metal jumper in a first recess over a first metal line and a second metal line, depositing a metal via in a second recess over a third metal line, where the metal jumper fills only a bottom portion of a first recess, and where the metal via completely fills the second recess; and depositing a dielectric material over the metal jumper to fill the first recess above the metal jumper. The described method of fabricating an interconnect structure provides the technical advantage over prior technology of having a metal line fabricated over a jumper without electrically connecting to the jumper. This advantage enables denser integrated circuit components.

In some embodiments, the method of fabricating an interconnect structure above where the metal jumper is formed in a lower portion of the first recess and, where a semiconductor material physically isolates the metal jumper from the second metal layer. The described method of fabricating an interconnect structure provides the technical advantage over prior technology of having a metal line fabricated over a jumper without electrically connecting to the jumper by creating a thinner jumper and depositing dielectric over the jumper.

In some embodiments, the method of fabricating an interconnect structure above where the semiconductor further isolates the metal jumper from the metal via. The described method of fabricating an interconnect structure provides the technical advantage over prior technology of having a metal line fabricated over a jumper (where the metal line is connected to a via in the same layer as the jumper) without electrically connecting to the jumper by creating a thinner jumper and depositing dielectric over the jumper.

In some embodiments, the method of fabricating an interconnect structure above, where the metal jumper and the metal via are formed using a block mask deposition process. The described method of fabricating an interconnect structure provides the technical advantage over prior technology of having a metal line fabricated over a jumper (where the metal line is connected to a via in the same layer as the jumper) without electrically connecting to the jumper by creating a thinner jumper and depositing dielectric over the jumper.

In some embodiments, the method of fabricating an interconnect structure above, where part way through the block mask deposition process a metal jumper region of the block mask is blocked off. The described method of fabricating an interconnect structure provides the technical advantage over prior technology of having a metal line fabricated over a jumper without electrically connecting to the jumper by creating a thinner jumper and depositing dielectric over the jumper.

In some embodiments, the method of fabricating an interconnect structure above, further comprising: etching a dielectric to form the first recess and the second recess. The described method of fabricating an interconnect structure provides the technical advantage over prior technology of having a metal line fabricated over a jumper (where the metal line is connected to a via in the same layer as the jumper) without electrically connecting to the jumper by creating a thinner jumper and depositing dielectric over the jumper.

In some embodiments, the method of fabricating an interconnect structure above, where the fourth metal line positioned over the metal via and the metal jumper. The described method of fabricating an interconnect structure provides the technical advantage over prior technology of creating a denser interconnect structure without shorts between jumpers and other lines.

In some embodiments, a method of fabricating an interconnect structure may comprise forming a first layer of an interconnect structure by depositing a first metal line, a second metal line, and a third metal line surrounded by a first dielectric material, forming a second layer of an interconnect structure comprising a second dielectric material with a metal jumper recess and a metal via recess, depositing a conformational dielectric material on top of the second layer such that the metal via recess is filled with the conformational dielectric material, removing a portion of the conformational dielectric material from the top of the second layer such that the conformational dielectric material remains in the metal via recess, depositing a metal jumper in the metal jumper recess, removing a top portion of the metal jumper, depositing a dielectric material over a remaining bottom portion of the metal jumper, removing the conformational dielectric material from the metal via recess; and depositing a metal via in the metal via recess. The described method of fabricating an interconnect structure provides the technical advantage over prior technology of having a metal line fabricated over a jumper without electrically connecting to the jumper. This advantage enables denser integrated circuit components.

In some embodiments, the method of fabricating an interconnect structure above, where the removing the portion of the conformational dielectric material is performed with a selective etching process. The described method of fabricating an interconnect structure provides the technical advantage over prior technology of having a metal line fabricated over a jumper (where the metal line is connected to a via in the same layer as the jumper) without electrically connecting to the jumper.

In some embodiments, the method of fabricating an interconnect structure above, where the metal jumper is isolated from the metal via. The described method of fabricating an interconnect structure provides the technical advantage over prior technology of having a metal line fabricated over a jumper (where the metal line is connected to a via in the same layer as the jumper) without electrically connecting to the jumper by creating a thinner jumper and depositing dielectric over the jumper.

In some embodiments, the method of fabricating an interconnect structure above, where the deposition of the conformational dielectric material on top of the second layer does not fill the metal jumper recess. The described method of fabricating an interconnect structure provides the technical advantage over prior technology of having a metal line fabricated over a jumper (where the metal line is connected to a via in the same layer as the jumper) without electrically connecting to the jumper with a simplified process.

In some embodiments, the method of fabricating an interconnect structure above, where a fourth metal line is deposited over the metal via and the dielectric in the metal jumper recess. The described method of fabricating an interconnect structure provides the technical advantage over prior technology of having a metal line fabricated over a jumper (where the metal line is connected to a via in the same layer as the jumper) without electrically connecting to the jumper. This advantage enables denser integrated circuit components.

In some embodiments, the method of fabricating an interconnect structure above, where the fourth metal line is electrically and physically isolated from the metal jumper. The described method of fabricating an interconnect structure provides the technical advantage over prior technology of having a metal line fabricated over a jumper (where the metal line is connected to a via in the same layer as the jumper) without electrically connecting to the jumper. This advantage enables denser integrated circuit components while maintaining and isolation between components.

In integrated circuits, interconnects are structures that connect two or more circuit elements (such as transistors or power rails) together electrically. In addition to providing the electrical connection to the frontend devices (such as transistors), interconnects also go all the way back to the power delivery networks. Thus, interconnects, and their surrounding support components, are considered back-end-of-line (BEOL) components. Lines and metal vias are the most important components of interconnect technology. Lines provide electrical connection within a single layer, and metal vias provide electrical connection between layers in a physical electronic circuit.

As technology continues to be scaled, and transistors are becoming smaller, increasingly tightly spaced interconnects are required to connect to them. Scaling interconnects pushes the boundaries of minimum widths, minimum spacings, and minimum pitches. However, these decreasing sizes and increasing densities introduce performance and reliability issues. In particular, critical dimensions refer to the sizes of electronic components that must be maintained to avoid unwanted impact on the electrical properties of the device. Accordingly, the geometric properties of interconnect structures are limited not only by fabrication constraints, but also by performance constraints.

Presently, placement of metal lines over an interconnect are restricted because they cannot be placed over a metal jumper without electrically connecting to the metal jumper. Thus, the integrated circuits have a significantly larger area resulting in an overall increased dimension. The illustrative embodiments described herein overcome the foregoing drawbacks by metal jumpers that only take up a lower portion of an interconnect layer leaving a dielectric buffer between the metal jumper and a metal line over the metal jumper. The described structure therefore has a significantly smaller area resulting in an overall decreased dimension since metal lines can be placed directly over metal jumpers without an electrical connection between the two.

Detailed embodiments of the interconnect structures and methods are disclosed herein. The method steps described below do not form a complete process flow for manufacturing integrated circuits, such as, semiconductor devices. The present embodiments can be practiced in conjunction with the integrated circuit fabrication techniques currently used in the art and only so much of the commonly practiced process steps are included as are necessary for an understanding of the described embodiments. The figures represent cross-section portions of a semiconductor structure after fabrication and are not drawn to scale, but instead are drawn to illustrate the features of the described embodiments. Specific structural and functional details disclosed herein are not to be interpreted as limiting, but merely as a representative basis for teaching one skilled in the art to variously employ the methods and structures of the present disclosure. In the description, details of well-known features and techniques may be omitted to avoid unnecessarily obscuring the presented embodiments.

It will be understood that, although the terms first, second, etc. may be used herein to describe various elements, these elements should not be limited by these terms. These terms are only used to distinguish one element from another element. Thus, a first element discussed below could be termed a second element without departing from the scope of the present concept.

As used herein, "height" refers to a vertical size of an element (e.g., a layer, trench, hole, opening, etc.) in the cross-sectional views measured from a bottom surface to a top surface of the element, and/or measured with respect to a surface on which the element is located. Conversely, a "depth" refers to a vertical size of an element (e.g., a layer, trench, hole, opening, etc.) in the cross-sectional views measured from a top surface to a bottom surface of the element. Terms such as "thick", "thickness", "thin" or derivatives thereof may be used in place of "height" where indicated.

As used herein, "width" or "length" refers to a size of an element (e.g., a layer, trench, hole, opening, etc.) in the drawings measured from a side surface to an opposite surface of the element. Terms such as "thick", "thickness", "thin" or derivatives thereof may be used in place of "width" or "length" where indicated.

In the interest of not obscuring the presentation of the embodiments of the present disclosure, in the following detailed description, some of the processing steps, materials, or operations that are known in the art may have been combined together for presentation and for illustration purposes and in some instances may not have been described in detail. Additionally, for brevity and maintaining a focus on distinctive features of elements of the present disclosure, description of previously discussed materials, processes, and structures may not be repeated with regard to subsequent Figures. In other instances, some processing steps or operations that are known may not be described. It should be understood that the following description is rather focused on the distinctive features or elements of the various embodiments of the present invention.

It is to be understood that the various layers, structures, and/or regions shown in the accompanying drawings are schematic illustrations that are not necessarily drawn to scale. In addition, for ease of explanation, one or more layers, structures, and regions of a type commonly used to form semiconductor devices or structures may not be explicitly shown in a given drawing. This does not imply that any layers, structures, and regions not explicitly shown are omitted from the actual semiconductor structures.

In general, the various processes used to form a semiconductor chip fall into four general categories, namely, film deposition, removal/etching, semiconductor doping, and patterning/lithography. Deposition is any process that grows, coats, or otherwise transfers a material onto the wafer. Available technologies include but are not limited to physical vapor deposition ("PVD"), chemical vapor deposition ("CVD"), electrochemical deposition ("ECD"), molecular beam epitaxy ("MBE") and more recently, atomic layer deposition ("ALD") among others. Another deposition technology is plasma enhanced chemical vapor deposition ("PECVD"), which is a process that uses the energy within the plasma to induce reactions at the wafer surface that would otherwise require higher temperatures associated with conventional CVD. Energetic ion bombardment during PECVD deposition can also improve the film's electrical and mechanical properties.

Semiconductor lithography is the formation of three-dimensional relief images or patterns on the semiconductor substrate for subsequent transfer of the pattern to the substrate. In semiconductor lithography, the patterns are formed by a light sensitive polymer called a photoresist. The patterns created by lithography or photolithography typically are used to define or protect selected surfaces and portions of the semiconductor structure during subsequent etch processes.

Removal is any process such as etching or chemical-mechanical planarization ("CMP") that removes material from the wafer. Examples of etch processes include either wet (e.g., chemical) or dry etch processes. One example of a removal process or dry etch process is ion beam etching ("IBE"). In general, IBE (or milling) refers to a dry plasma etch method that utilizes a remote broad beam ion/plasma source to remove substrate material by physical inert gas and/or chemical reactive gas means. Like other dry plasma etch techniques, IBE has benefits such as etch rate, anisotropy, selectivity, uniformity, aspect ratio, and minimization of substrate damage. Another example of a dry etch process is reactive ion etching ("RIE"). In general, RIE uses chemically reactive plasma to remove material deposited on wafers. High-energy ions from the RIE plasma attack the wafer surface and react with the surface material(s) to remove the surface material(s).

Suitable conductive metals for the metal lines, metallization layers, metal jumpers or metal vias may include, for example, aluminum (Al), chromium (Cr), cobalt (Co), hafnium (Hf), iridium (Ir), molybdenum (Mo), nickel (Ni), niobium (Nb), osmium (Os), rhenium (Re), rhodium (Rh), ruthenium (Ru), tantalum (Ta), titanium (Ti), tungsten (W), vanadium (V), zirconium (Zr), and alloys thereof. It is notable that metals such as copper (Cu) are not easily patterned in this manner using a subtractive etch. Namely, Cu does not provide any volatile product while reacting with common etchant gases (e.g., fluorine, chlorine, oxygen, hydrogen etc.). As a result, it has a very slow etch rate to enable subtractive etching of Cu lines. Thus, conductive metals such as Co, Ru, Mo and/or W are employed.

Suitable material for dielectric materials may include, for example, oxide low-k materials such as silicon oxide ($SiO_x$) and/or oxide ultralow-k interlayer dielectric (ULK-ILD) materials, e.g., having a dielectric constant k of less than 2.7. By comparison, silicon dioxide ($SiO_2$) has a dielectric constant k value of 3.9. Suitable ultralow-K dielectric materials include, for example, porous organosilicate glass (pSiCOH). A process such as CVD, ALD, or PVD can be used to deposit dielectric materials.

In some embodiments, a planarization process such as a standard planarization process (e.g., a CMP process) can be carried out to planarize an upper surface a layer before, during, and/or after the processing steps described herein.

In some instances, hard mask materials described herein may include, for example, SiN, a multi-layer of SiN and $SiO_2$, or another suitable material.

In some instances, selective etching is a process specific materials are intentionally and preferentially removed from a substrate while leaving others unaffected. In some instances, material removal is accomplished by utilizing carefully selected etchants (i.e., chemicals that react with certain materials while not or minimally reacting with others). For example, Reactive Ion Etching (RIE) is a method where reactive gases, such as fluorine-based compounds, are employed to selectively etch materials like silicon or metal oxides while preserving other substances on the substrate.

In some instances, damascene is a semiconductor fabrication technique used to create metal interconnects or wiring patterns in and on a chip. The damascene process is particularly employed in advanced integrated circuit manufacturing for its ability to enhance planarization and reduce processing complexity. In some instances, the damascene process may include, for example, dielectric deposition, pattern formation, pattern formation, etching, barrier layer deposition, metal deposition, and chemical mechanical polishing (CMP). In some embodiments, the deposition of metal components may be performed with a single damascene, dual damascene, a subtractive process, and/or another deposition process.

In some embodiments, dielectric deposition includes depositing dielectric material, often composed of low-k dielectrics (materials with low permittivity), onto a semiconductor wafer. This dielectric layer serves as an insulating material between metal layers.

In some embodiments, pattern formation involves a photoresist or other masking material is applied to the dielectric layer, and a pattern is defined using lithography techniques. The pattern represents the locations where the metal interconnects will be formed.

In some embodiments, etching involves using the pattern as a mask, the dielectric layer is selectively etched to create trenches or cavities where the metal will be deposited.

In some embodiments, barrier layer deposition involves a thin barrier layer, for example composed of materials like tantalum (Ta) or tantalum nitride (TaN), being deposited to prevent the diffusion of metal atoms into the surrounding dielectric material.

In some embodiments, in metal deposition a metal is deposited into the trenches, filling the patterned regions and creating the metal interconnects.

In some embodiments, the excess metal on the surface is removed through CMP, a process that planarizes the wafer and leaves the metal only in the trenches.

The damascene process is advantageous for several reasons, including improved planarization, reduced processing steps compared to older techniques, and the ability to create intricate and densely packed metal structures.

It is to be understood that the terms “about” or “substantially” as used herein with regard to thicknesses, widths, percentages, ranges, etc., are meant to denote being close or approximate to, but not exactly. For example, the term “about” or “substantially” as used herein implies that a small margin of error may be present, such as 1% or less than the stated amount.

Note also that the interconnect structure described herein can also be considered to be a semiconductor device and/or an integrated circuit, or some part thereof. For the purpose of clarity, some fabrication steps leading up to the production of the interconnect structures are omitted. In other words, one or more well-known processing steps which are not illustrated but are well-known to those of ordinary skill in the art have not been included in the figures. This is not intended to be interpreted as a limitation of any particular embodiment, or illustration, or scope of the claims.

FIG. 1A-F depict a side cross-sectional view of interconnect structure 100 at various stages of processing. In some embodiments, FIG. 1A-F may depict one or more aspects of a damascene method of processing electronic components. During this stage, a first metallization layer including lines 102A-C (e.g., 102A, 102B, and 102C), are formed on and/or in dielectric 110. In some embodiments, dielectric 110 and lines 102A-C may be formed on a substrate (not depicted). In an illustrative embodiment, a substrate can include a semiconductor material such as, for example, silicon, germanium, silicon-germanium alloy, silicon carbon alloy, silicon-germanium-carbon alloy, gallium arsenide, indium arsenide, indium phosphide, III-V compound semiconductor materials, II-VI compound semiconductor materials, organic semiconductor materials, and other compound semiconductor materials. Typically, the semiconductor material includes silicon. The substrate can include a bulk semiconductor substrate or a semiconductor-on-insulator (SOI) substrate. In an illustrative embodiment, a substrate may already have pre-built structures (not shown) such as a field effect transistor, a transistor, a diode, a resistor, a capacitor, an inductor, an interconnect, an electrically programmable fuse, or any combination thereof.

Figure 1B:
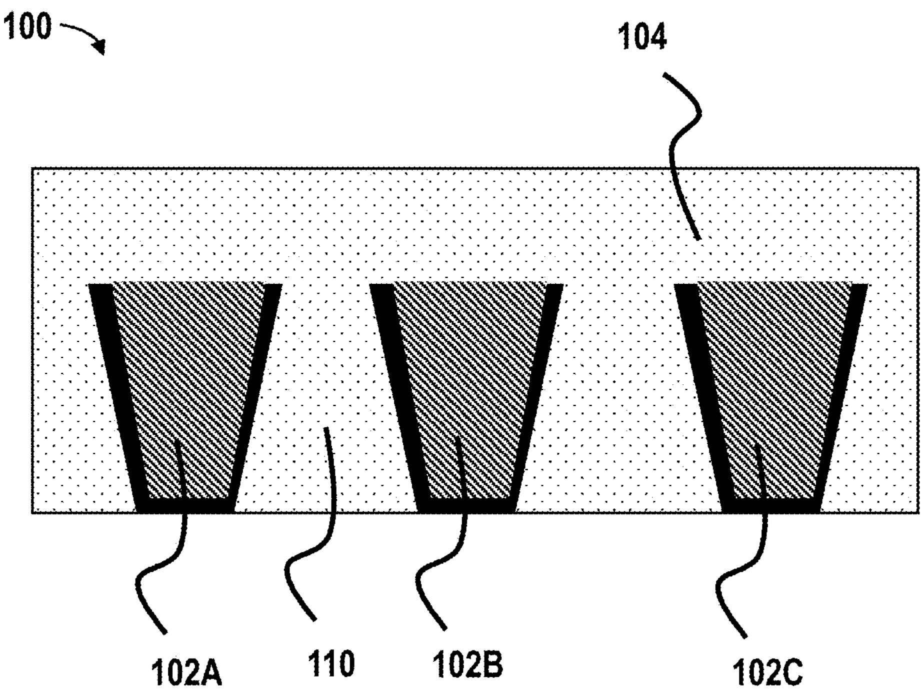

FIG. 1B depicts dielectric 104 deposited on top of metal lines 102A-C and dielectric 110.

Figure 1C:
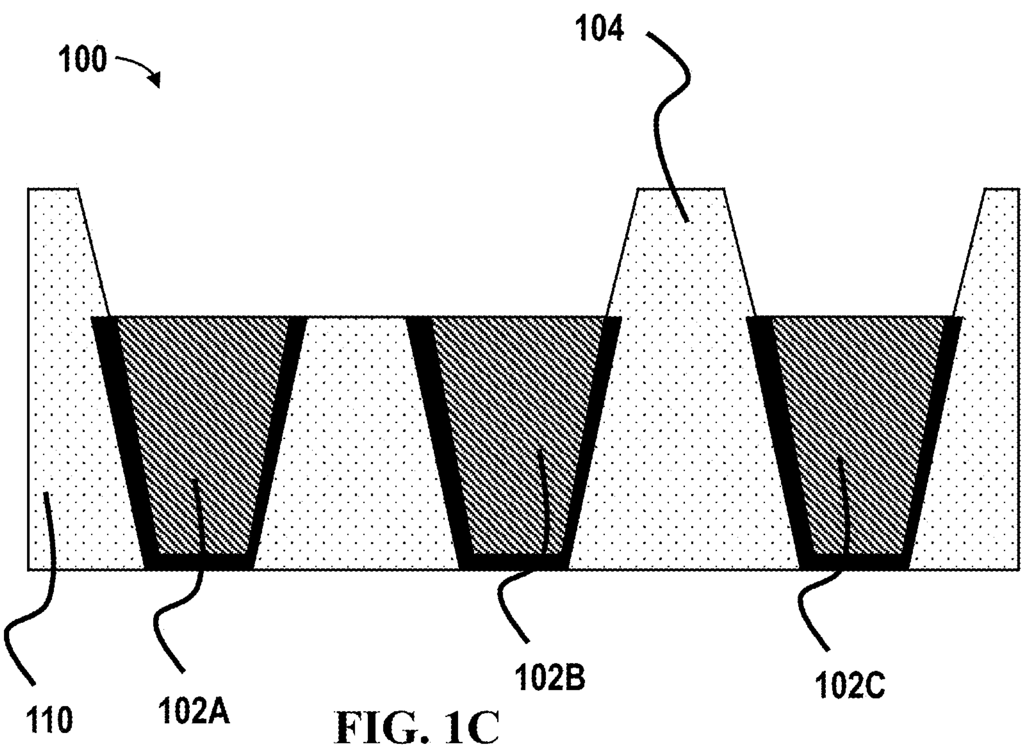
Figure 1D:
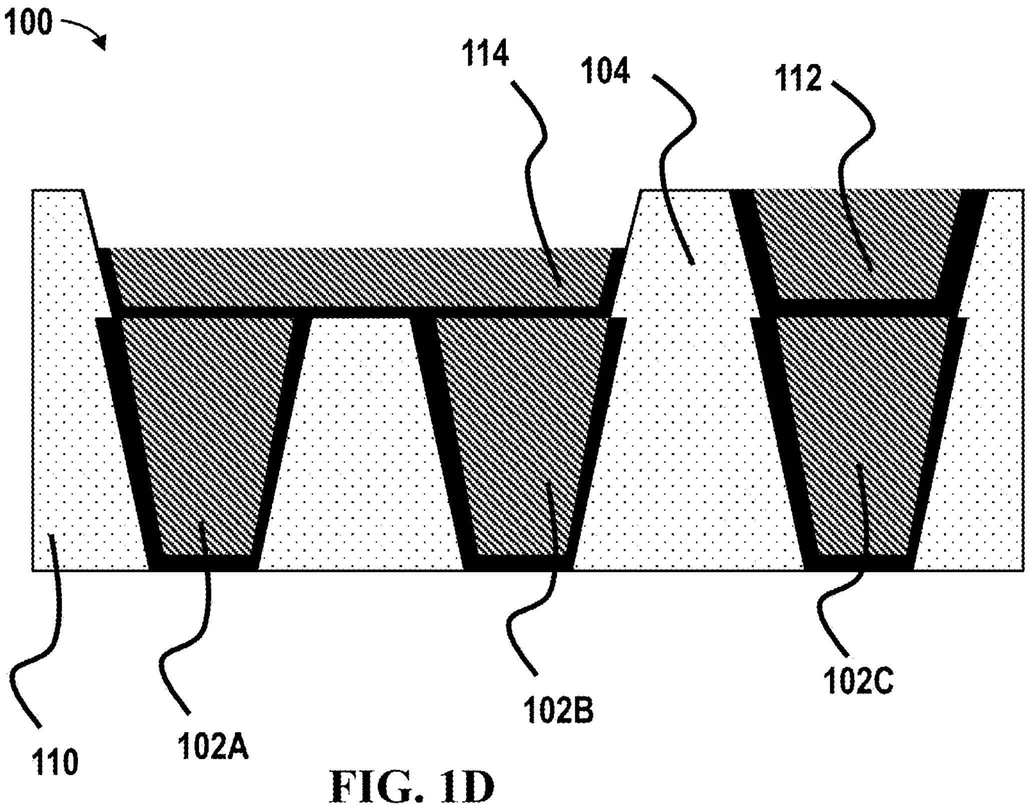

FIG. 1C further depicts interconnect structure 100 where areas have been etched away for further deposition of metal lines including at least one metal via 112 and one metal jumper 114 (depicted in FIG. 1D). It is to be understood that although one metal via 112 and metal jumper 114 are shown, they are merely illustrative and any number of metal vias and metal jumpers are contemplated. In an illustrative embodiment, an additive patterning process is used to form the metal jumper 114 at least one metal via 112 in the interconnect structure. For example, via 112 may be deposited with a single damascene or dual damascene process.

In some embodiments, a block mask may be used to deposit metal jumper 114 and metal via 112. In some instances, the block mask is designed in a specific pattern to cover the areas where dielectric deposition is not desired part way during the deposition process. This pattern is often created using photolithography or other patterning techniques. In some instances, the block mask is applied to the interconnect device 100 before the dielectric deposition process. In some instances, block masking may be performed through a series of steps, including coating the interconnect device 100 with the block mask material and then exposing it to light through a patterned mask or using other methods to create the desired pattern. In some instances, a second coating process may be used to block off the metal jumper 114 part way through the deposition so the metal jumper 114 is not deposited as thickly as the metal via 111. In some embodiments, once the block mask is applied, the metal in the region of the metal jumper 114 is recessed using wet chemistry while the other vias (112) are protected by the block mask. In some instances, the dielectric material is deposited onto the interconnect device 100, but where the block mask is present, the dielectric material is prevented from adhering to the interconnect device 100. This results in a patterned deposition where dielectric material is only present in specific areas. In some instances, after the dielectric deposition is complete, the block mask is often removed through processes such as etching, stripping, or other techniques, leaving behind the desired pattern of dielectric material. In some embodiments, metal jumper 114 is electrically connected to metal lines 102A-B and electrically isolated from metal line 102C. In some embodiments, metal via 112 is electrically connected to metal line 102C and electrically isolated from metal lines 102 A-B.

In some embodiments, metal jumper 114 is depicted as being connected to only 2 metal lines (102A-B), however a metal jumper, such as the examples described in this disclosure may be connected to as many lines as conceivably possible. Only two lines are depicted for clarity purposes.

Figures 1E, 1F:
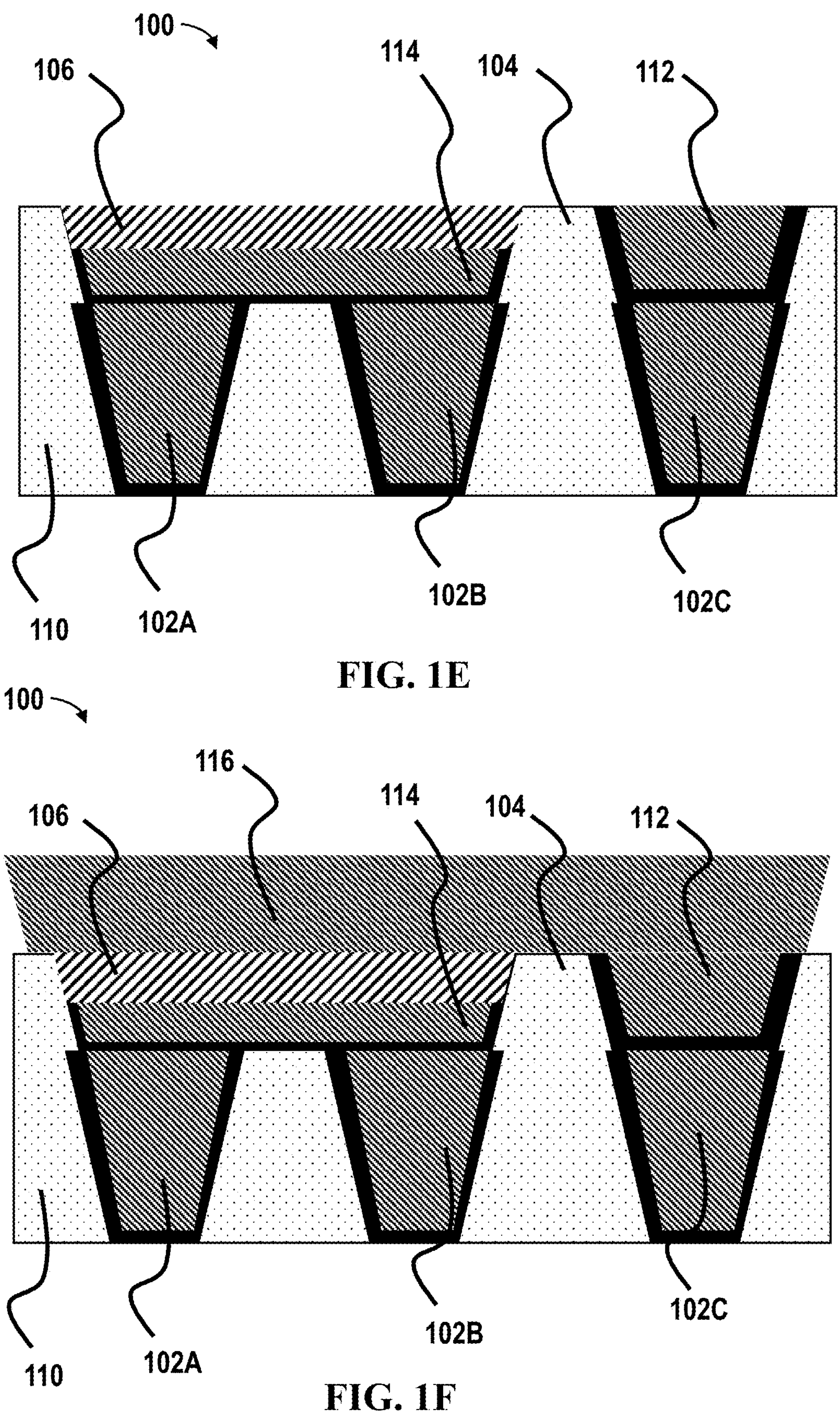

In FIG. 1E, dielectric 106 is deposited in the void above metal jumper 114, filling the void up to the level of dielectric 104 and metal via 112.

In FIG. 1F, metal line 116 may be deposited on top of dielectric 104, dielectric 106 and metal via 112. In some embodiments, dielectric 106 prevents metal line 116 and metal jumper 114 from electrically connecting.

FIG. 2A-J depicts interconnect structure 200 at various stages of processing for an embodiment for depositing a metal jumper. In some embodiments, FIG. 2A-J may depict one or more aspects of a damascene method of processing electronic components. During this stage, a first metallization layer including lines 202A-C (e.g., 202A, 202B, and 202C), are formed on and/or in substrate 210 (depicted here as in substrate 210). In an illustrative embodiment, substrate 210 can include a semiconductor material such as, for example, silicon, germanium, silicon-germanium alloy, silicon carbon alloy, silicon-germanium-carbon alloy, gallium arsenide, indium arsenide, indium phosphide, III-V compound semiconductor materials, II-VI compound semiconductor materials, organic semiconductor materials, and other compound semiconductor materials. Typically, the semiconductor material includes silicon. The substrate 210 can include a bulk semiconductor substrate or a semiconductor-on-insulator (SOI) substrate. In an illustrative embodiment, substrate 210 may already have pre-built structures (not shown) such as a field effect transistor, a transistor, a diode, a resistor, a capacitor, an inductor, an interconnect, an electrically programmable fuse, or any combination thereof.

Figure 2A:
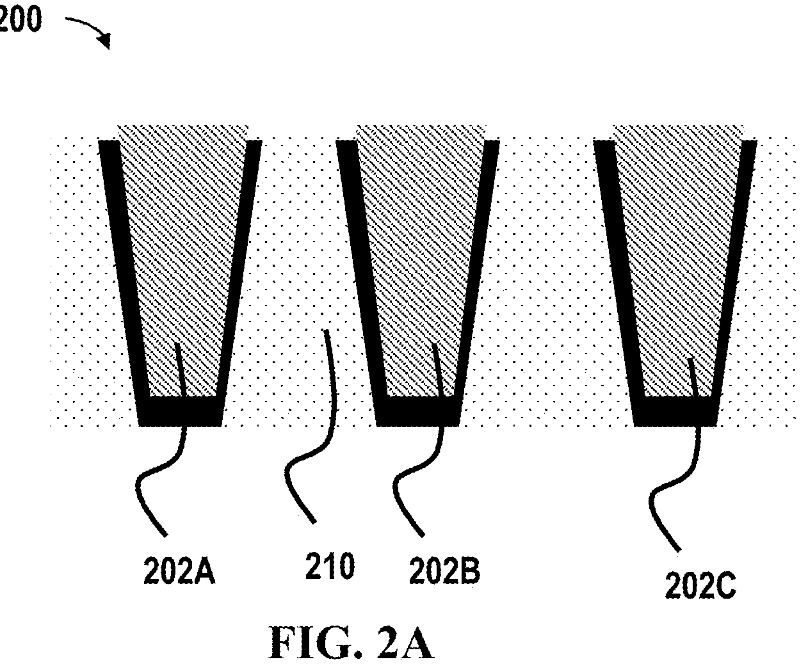
FIGS. 2A, 2B, 2C, 2D, 2E, 2F, 2G, 2H, 2I, and 2J illustrate an example interconnect structure in various stages of processing, according to various embodiments of the present disclosure.
Figure 2B:
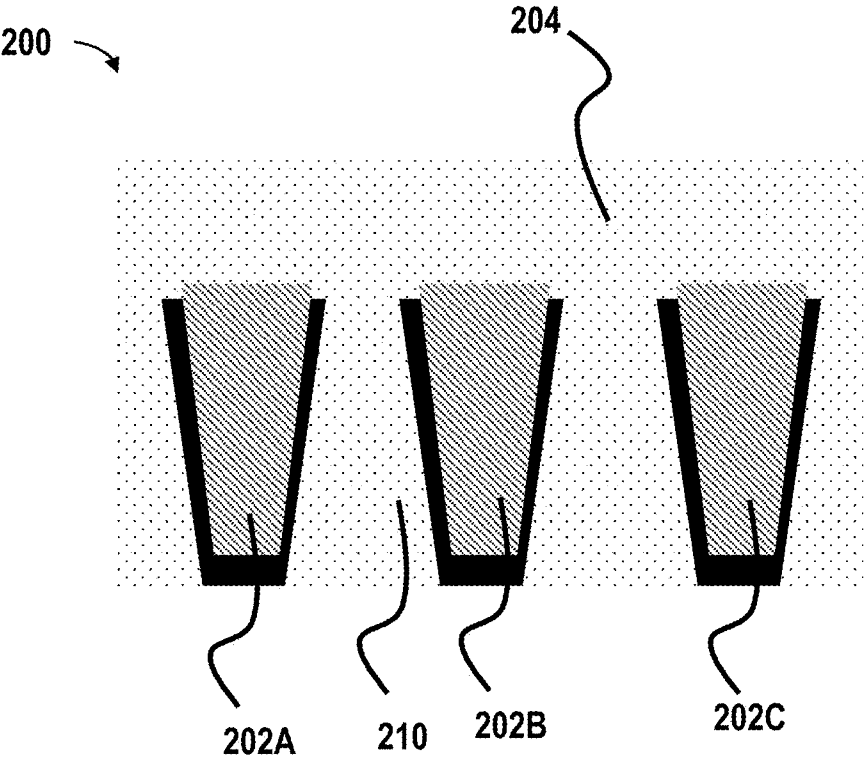

FIG. 2B depicts dielectric 204 deposited on top of metal lines 202A-C and substrate 210.

Figures 2C, 2D:
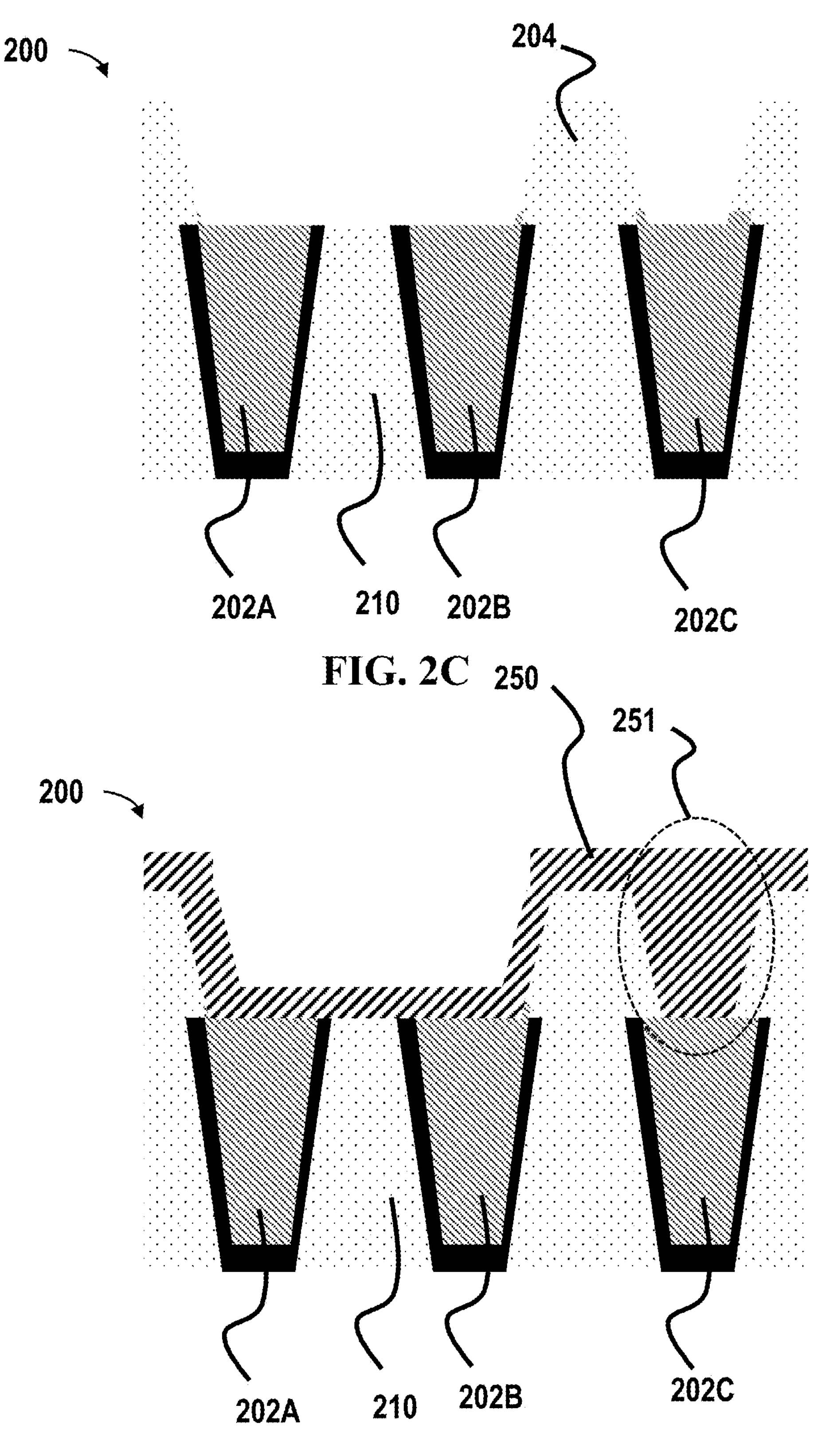

FIG. 2C further depicts interconnect structure 200 where areas have been etched away for further deposition of metal lines including at least one metal via 212 and one metal jumper 214 (depicted in FIG. 1G).

FIG. 2D depicts a sacrificial conformational dielectric deposition and pinch-off to close off metal via recess 251. In some embodiments, "pinch off" refers to a process where the deposited material narrows or closes off an opening or trench during the deposition process. In some instances, pinch off occurs in regions with high aspect ratios, such as narrow gaps or trenches, where the width is comparable to or smaller than the thickness of the deposited material. In some embodiments, the sacrificial dielectric 250 is deposited approximately evenly across the surface, but because of the narrow diameter of metal via recess 251, the dielectric effectively fills up the recess. In some embodiments, the material for sacrificial dielectric 250 may be selected such that it may be selectively etched away leaving permanent dielectrics in place.

Figure 2E:
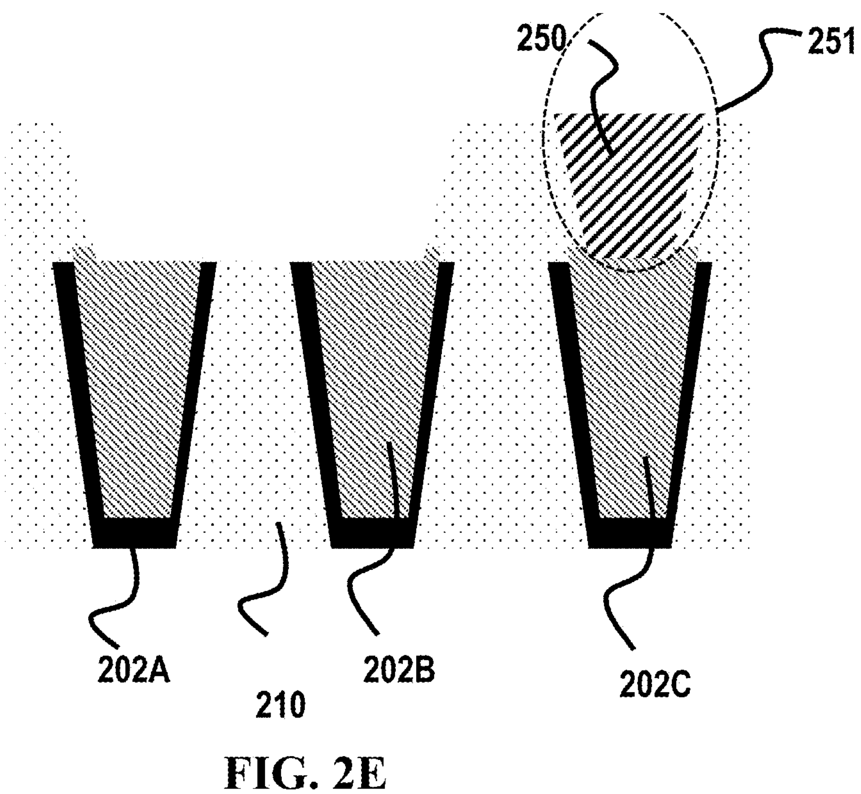

FIG. 2E depicts interconnect structure 200 after an isotropic liner etch. In some instances, isotropic liner etching is a process in semiconductor manufacturing that involves the removal of material from the sidewalls of a feature or trench, creating a conformal thin layer. Unlike anisotropic etching, which selectively removes material in a specific direction, isotropic etching occurs uniformly in all directions. Here, sacrificial dielectric 250 has been removed along the surface of interconnect structure 200. However, since closed off metal via recess 251 is deeper than the other regions of sacrificial dielectric 250, a portion of sacrificial dielectric 250 will remain in metal via recess 251.

Figure 2F:
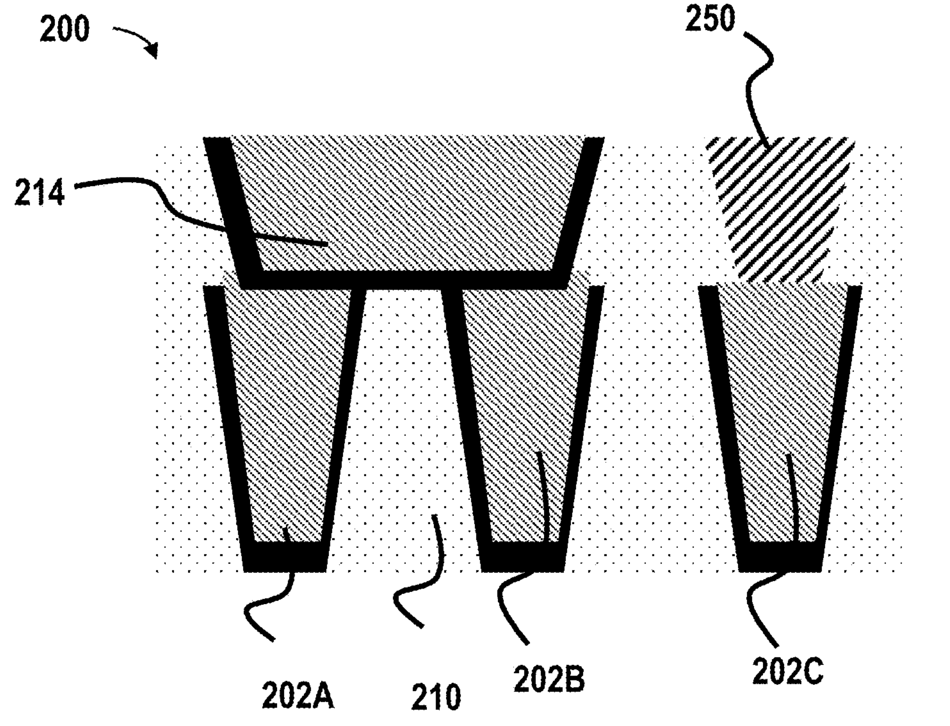

FIG. 2F depicts interconnect structure 200 after metal jumper 214 has been added. In some embodiments, the metal jumper 214 may be deposited using a mask or another method of selectively depositing a metal jumper.

Figures 2G, 2H:
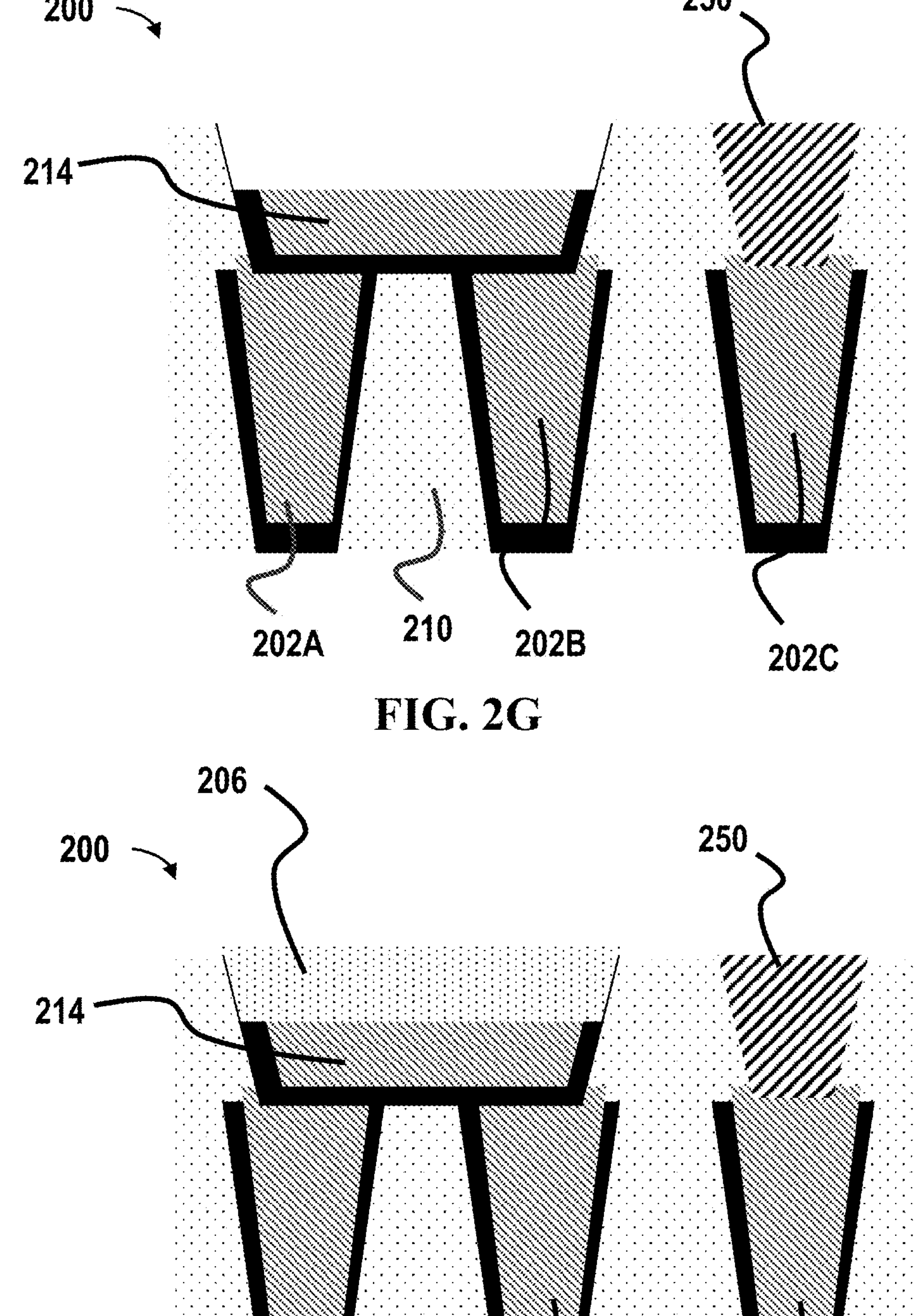

FIG. 2G depicts interconnect structure 200 after metal jumper 214 has been partially etched away. In some instances, various methods are employed for etching metal lines to selectively remove an upper portion of metal jumper 214. In some embodiments, approximately 50% of the thickness may be removed from metal jumper 214. For example, the etching may be wet etching, dry etching, plasma etching ion milling, and/or electrochemical etching. In some instance, the choice of method depends on factors like metal type, pattern requirements, and manufacturing considerations. In some instances, a combination of methods may be used to achieve the desired results.

FIG. 2H depicts interconnect structure after dielectric backfilling and chemical mechanical polishing (CMP). In some instances, the area above metal jumper 214 may be filled with dielectric backfilling 206. In some instances, dielectric backfilling involves filling gaps or trenches between metal or semiconductor structures with a dielectric material. In some instances, CMP is employed to achieve a flat and uniform surface on interconnect structure 200, facilitating the fabrication of subsequent layers and improving device performance. In some instances, CMP is a planarization technique that involves simultaneously applying chemical and mechanical forces to the surface of a semiconductor wafer.

Figures 2I, 2J:
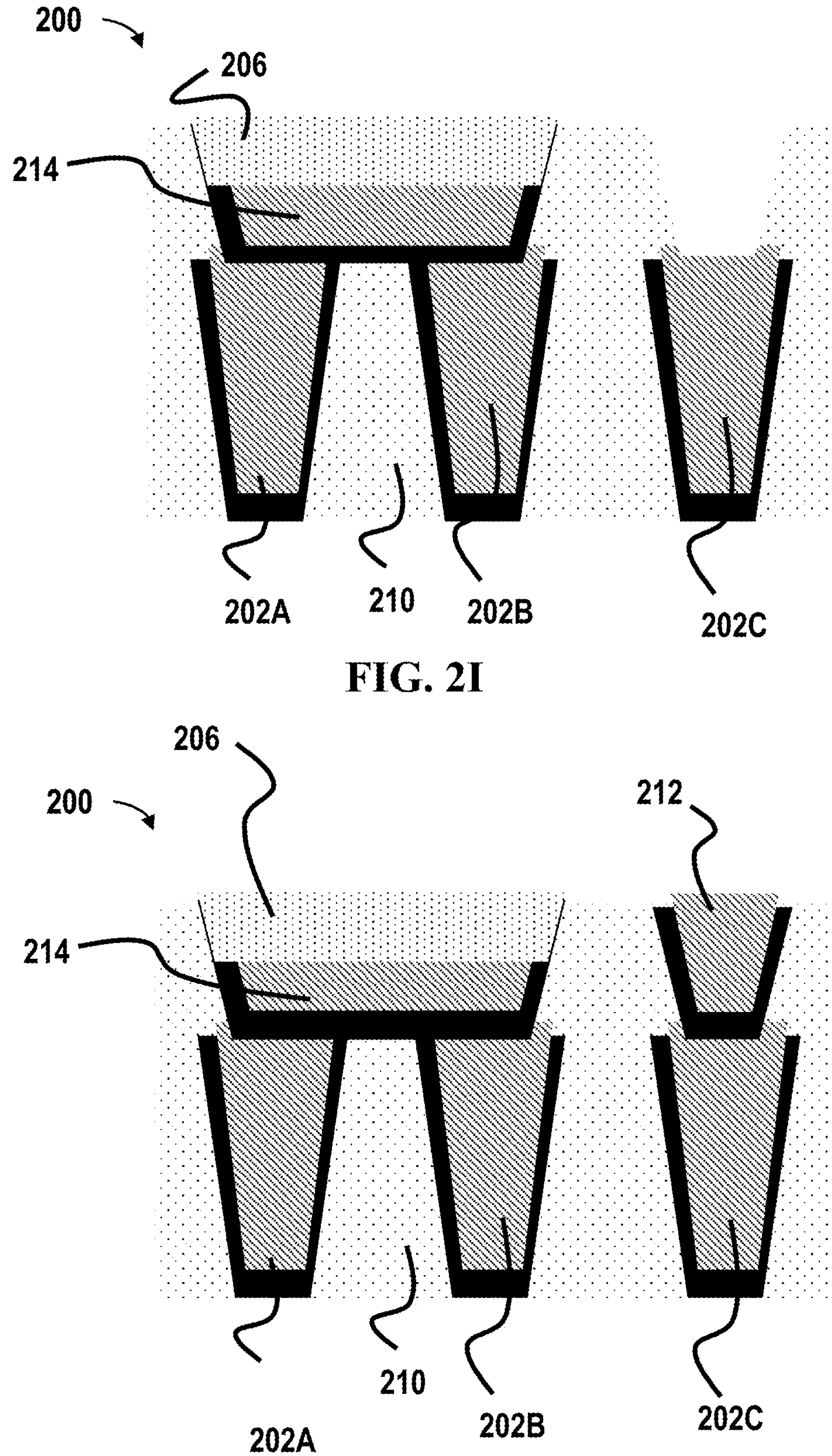

FIG. 2I depicts interconnect structure 200 after removal of the remaining sacrificial dielectric 250. In some embodiments, the etchant is selected such that it removes sacrificial dielectric 250 but not dielectric 206 and 210.

FIG. 2J depicts interconnect structure 200 after metallization of metal via 212. In some embodiments, a metal line (not depicted) may be deposited onto the surface of interconnect structure 200, similar to metal line 116 in FIG. 1F.

In some embodiments, metal jumper 214 is electrically connected to metal lines 202A-B and electrically isolated from metal line 202C. In some embodiments, metal via 212 is electrically connected to metal line 202C and electrically isolated from metal lines 202 A-B.

FIG. 3A-I depicts interconnect structure 300 at various stages using a subtractive process.

Figure 3A:
FIGS. 3A, 3B, 3C, 3D, 3E, 3F, 3G, 3H, and 3I illustrate an example interconnect structure in various stages of processing, according to various embodiments of the present disclosure.
Figure 3A:
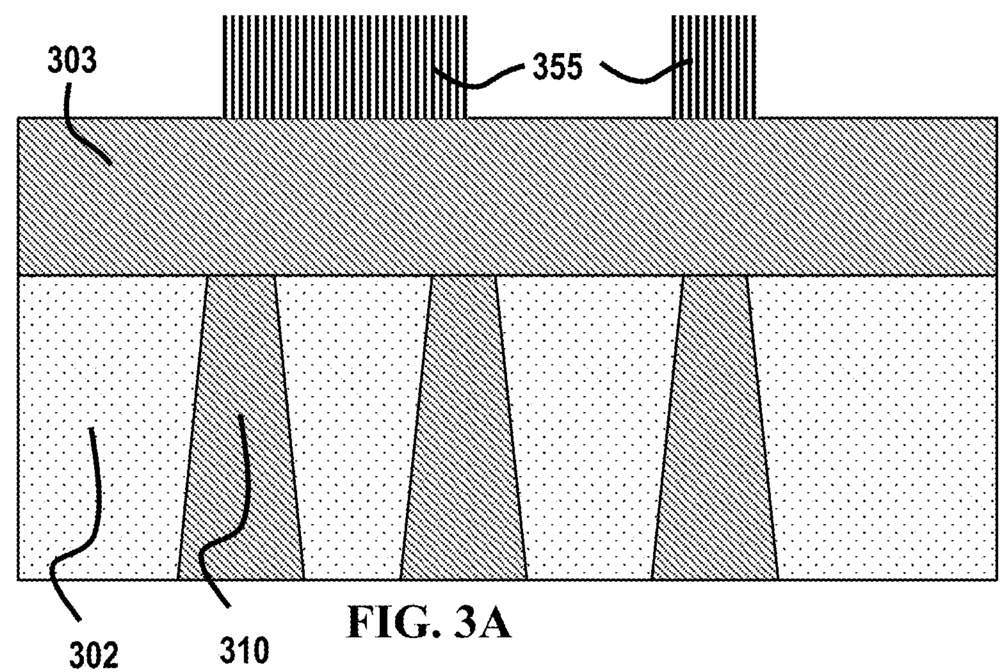

FIG. 3A depicts dielectric 302 with metal lines 310 as a basis for structure 300. In some embodiments, metal layer 303 is deposited on dielectric 302 and metal lines 310. In some embodiments, hard mask 355 is deposited on the surface of metal layer 303. In some instances, the hard mask is composed of materials with high hardness and resistance to etching processes such as silicon nitride ($Si_3N_4$), silicon carbide (SiC), or other materials. In some instances, the hard mask material is deposited onto the substrate using a specific deposition technique such as Chemical Vapor Deposition (CVD) or Physical Vapor Deposition (PVD). In some instances, after deposition, a pattern is transferred to the hard mask using photolithography or another patterning technique. For example, a photoresist may be applied to the hard mask, exposed to light through a mask with the desired pattern, and then developed to selectively remove parts of the photoresist, leaving the pattern. In some instances, the pattern is then transferred from the photoresist to the hard mask using an etching process. In some instances, depending on the process used, the photoresist may need to be stripped away.

Figure 3B:
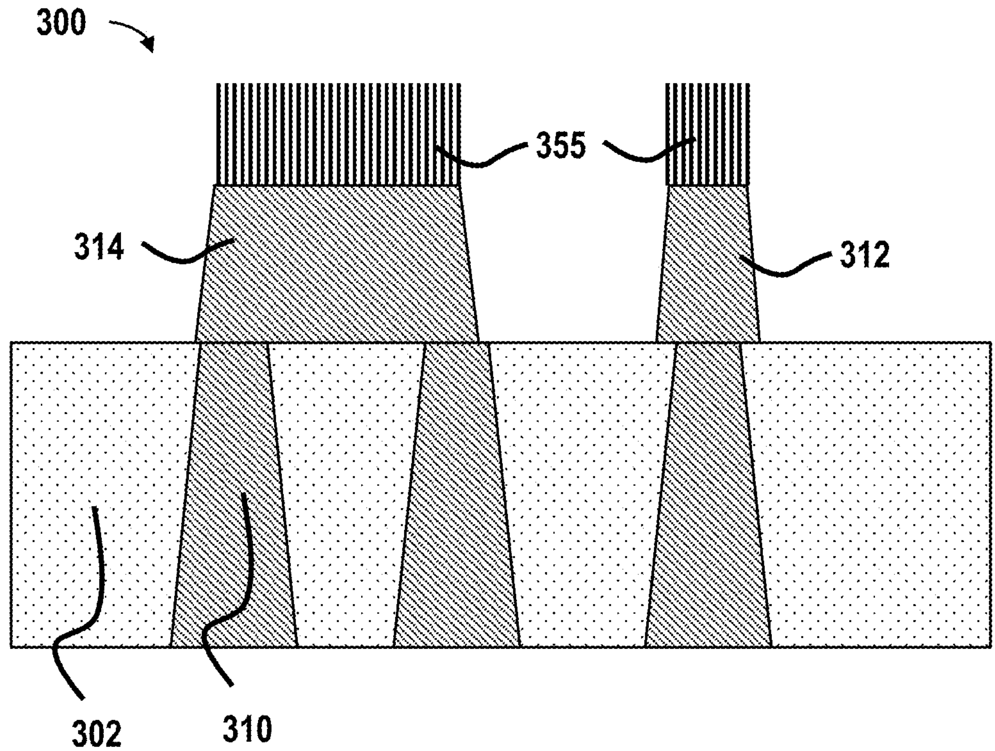

FIG. 3B, depicts interconnect structure 300 after a hard metal etch. In some embodiments, the hard metal etch forms metal jumper 314 and metal via 312 by removing portions of metal layer 303. In some instances, direct metal etch is a process in semiconductor manufacturing where metal layers on a substrate are selectively removed or etched. In some embodiments, the hard mask prevents metal from being etched away below the hard mask as seen in FIG. 3B.

Figures 3C, 3D:
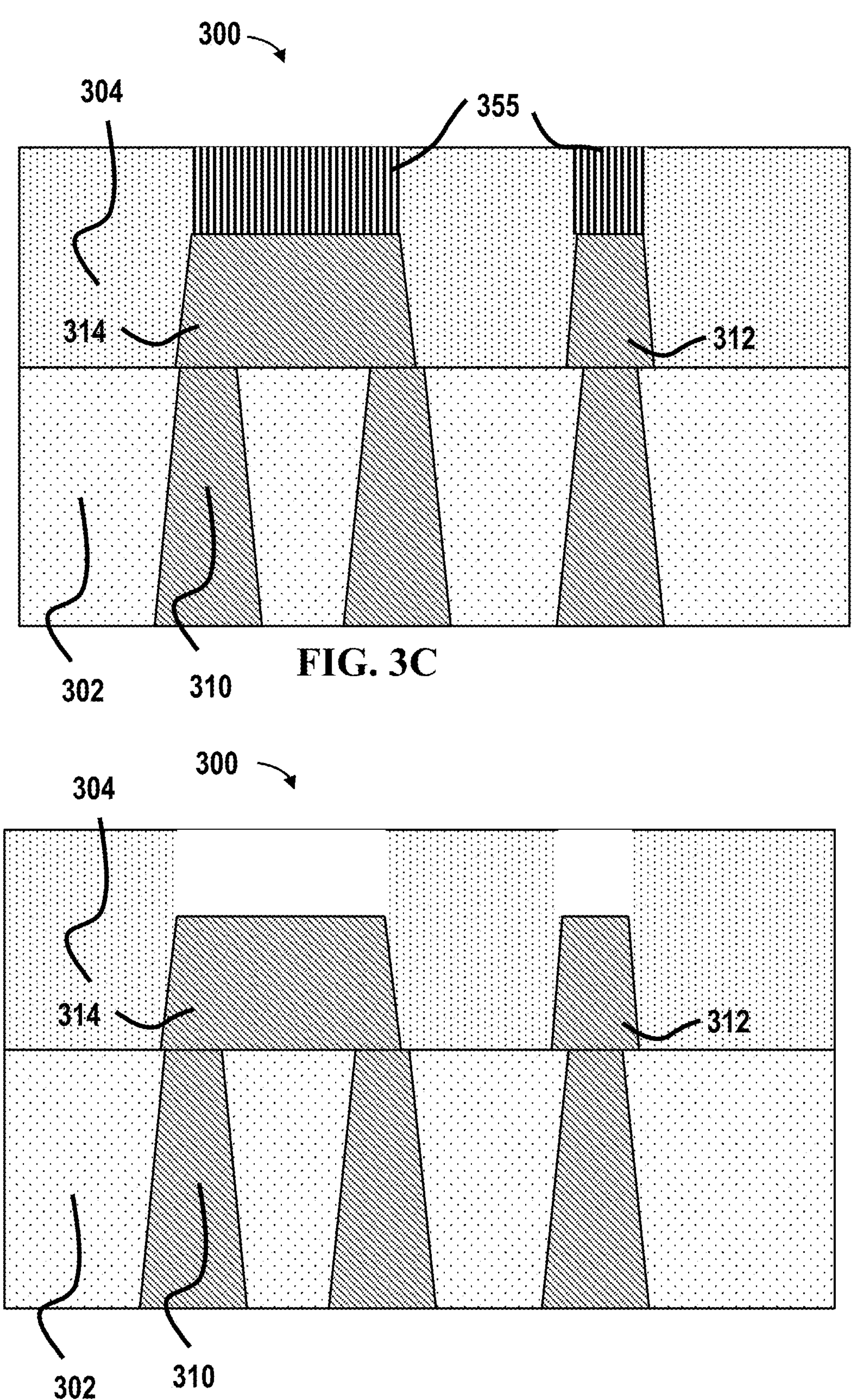

FIG. 3C, depicts interconnect structure 300 after a sacrificial dielectric backfill. For example, sacrificial dielectric material 304 (e.g., a second sacrificial dielectric material) surrounds hard mask 355, metal jumper 314 and metal via 312. In some instances, dielectric backfill refers to the process in semiconductor manufacturing where gaps or trenches between metal or semiconductor structures are filled with a dielectric material, for example, the dielectric may be an insulator such as silicon dioxide.

FIG. 3D depicts interconnect structure 300 after an etching process has been employed to remove the hard mask 355 creating voids above metal jumper 314 and metal via 312.

Figure 3E:
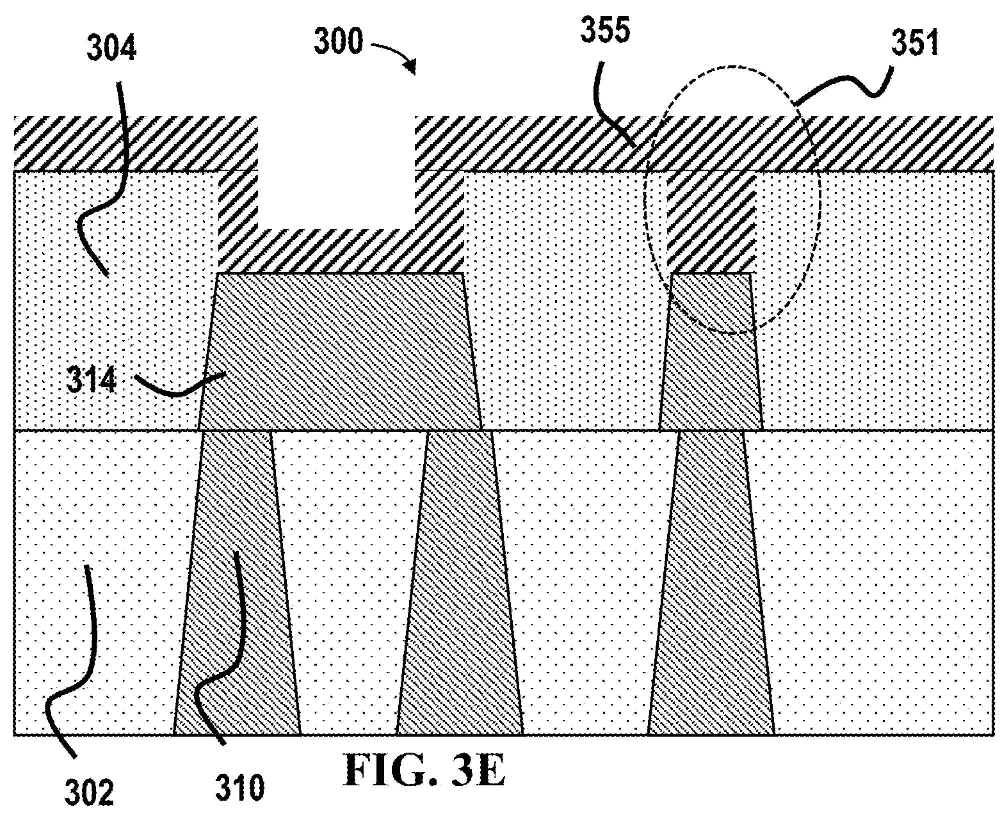

FIG. 3E depicts interconnect structure 300 after a sacrificial conformational dielectric deposition and pinch-off to close off metal via recess 351. In some embodiments, the sacrificial dielectric 355 (e.g., a first sacrificial dielectric material) is deposited approximately evenly across the surface, but because of the narrow region of metal via recess 351, the dielectric effectively fills up the recess. In some embodiments, the material for sacrificial dielectric 355 may be selected such that sacrificial dielectric 355 may be selectively etched away leaving permanent dielectrics in place. In some embodiments, a sacrificial dielectric material may be a material designed to be removed during processing with a specific etchant that does not react with other exposed materials on the interconnect structure. In some embodiments, multiple sacrificial dielectric materials and multiple corresponding etchants may be used.

Figure 3F:
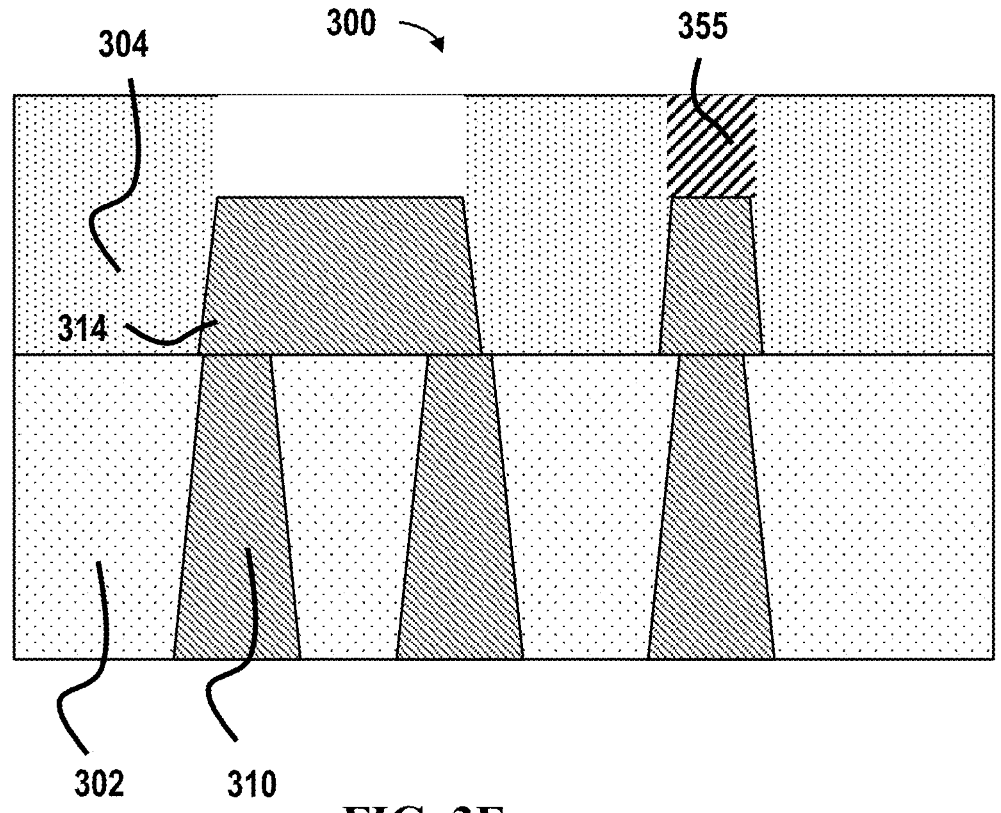

FIG. 3F depicts interconnect structure 300 after an isotropic liner etch. In some embodiments, the isotropic liner etch is designed to remove sacrificial dielectric 355 but not sacrificial dielectric material 304. In some embodiments, sacrificial dielectric 355 may be removed along the surface of interconnect structure 300. However, since closed off metal via recess 351 is deeper than the other regions of sacrificial dielectric 355, a portion of sacrificial dielectric 355 will remain in metal via recess 351.

Figure 3G:
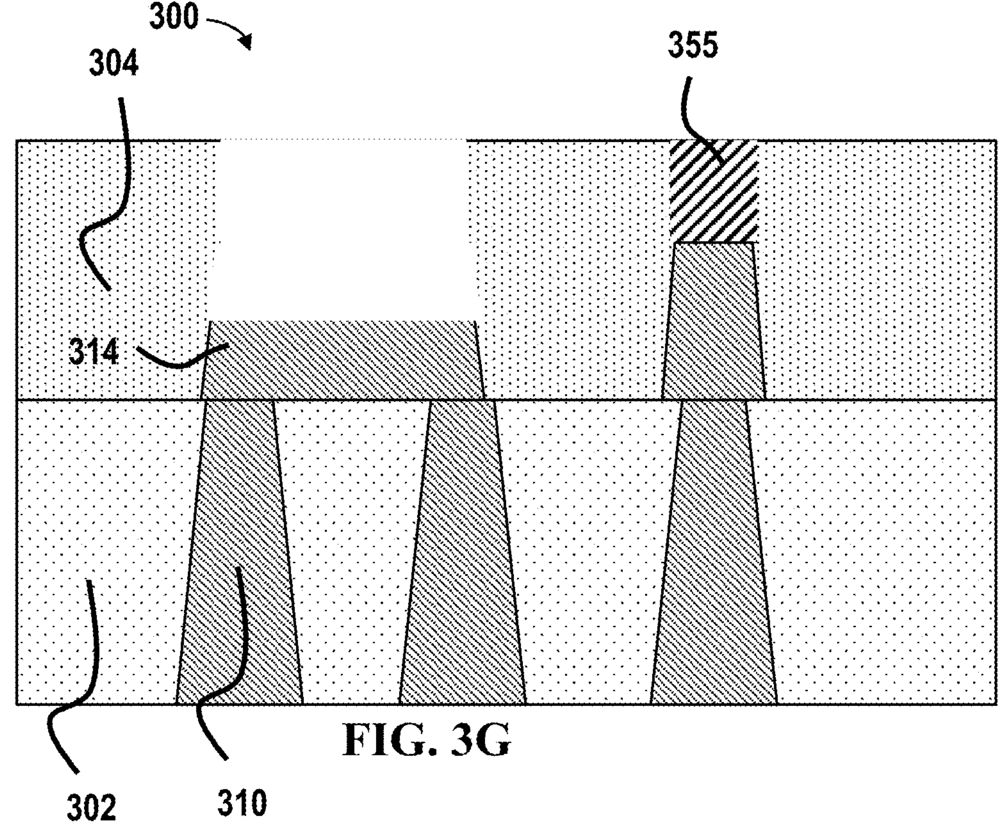

FIG. 3G depicts interconnect structure 300 after metal jumper 314 has been partially etched away. In some instances, various methods are employed for etching metal lines to selectively remove an upper portion of metal jumper 314. In some embodiments, approximately 50% of the thickness may be removed from metal jumper 314. For example, the etching may be wet etching, dry etching, plasma etching ion milling, and/or electrochemical etching. In some instances, the choice of method depends on factors like metal type, pattern requirements, and manufacturing considerations. In some instances, a combination of methods may be used to achieve the desired results.

Figure 3H:
Figure 3H:
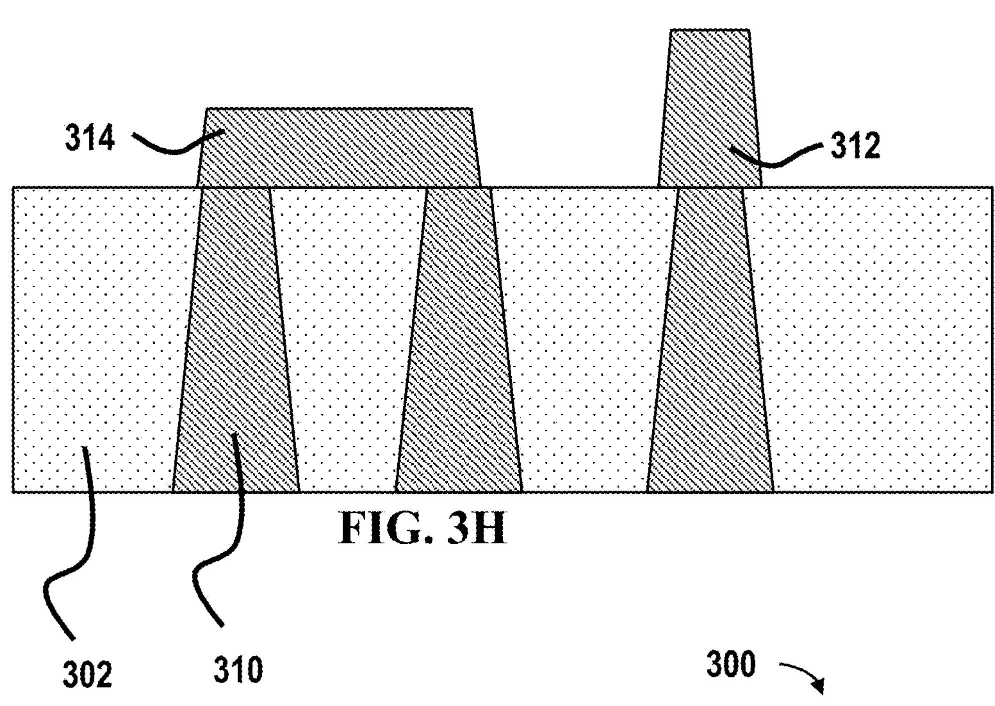

FIG. 3H depicts interconnect structure 300 after etching away sacrificial dielectric material 304 and remaining hard mask 355. In some embodiments, the materials comprising sacrificial dielectric material 304 and hard mask 355 and the etchant used to etch sacrificial dielectric material 304 and hard mask 355 away may be selected such that dielectric 302 is not etched away. In some instances, the selective etching of certain dielectrics over others is achieved by tailoring etchants to exploit the distinct chemical properties of different materials. For example, hydrofluoric acid (HF) is commonly used to selectively etch silicon dioxide ($SiO_2$) while leaving materials like silicon nitride ($Si_3N_4$) unaffected. HF is effective because it reacts strongly with $SiO_2$, forming volatile silicon fluoride ($SiF_4$) and water, but it does not significantly react with $Si_3N_4$. Similarly, a mixture of phosphoric acid ($H_3PO_4$), acetic acid ($CH_3COOH$), and nitric acid ($HNO_3$) is often employed to selectively etch silicon dioxide over silicon nitride. This mixture preferentially attacks the silicon dioxide layer due to the specific chemical interactions between the acids and the $SiO_2$ structure, while the silicon nitride remains relatively inert.

Figure 3I:
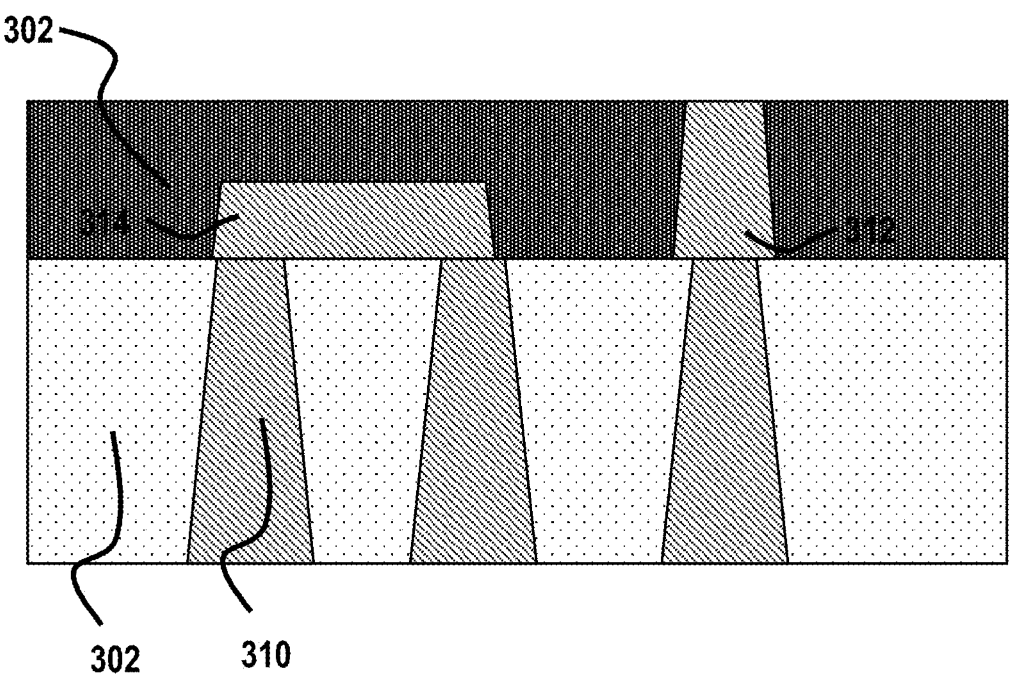

FIG. 3I depicts interconnect structure 300 after depositing dielectric 302. In some embodiments, the deposition covers metal jumper 314 but does not cover metal via 312 such that a metal line deposited over dielectric 302 and metal via 312 will be electrically connected to metal via 312 but not metal jumper 314.

Figure 4:
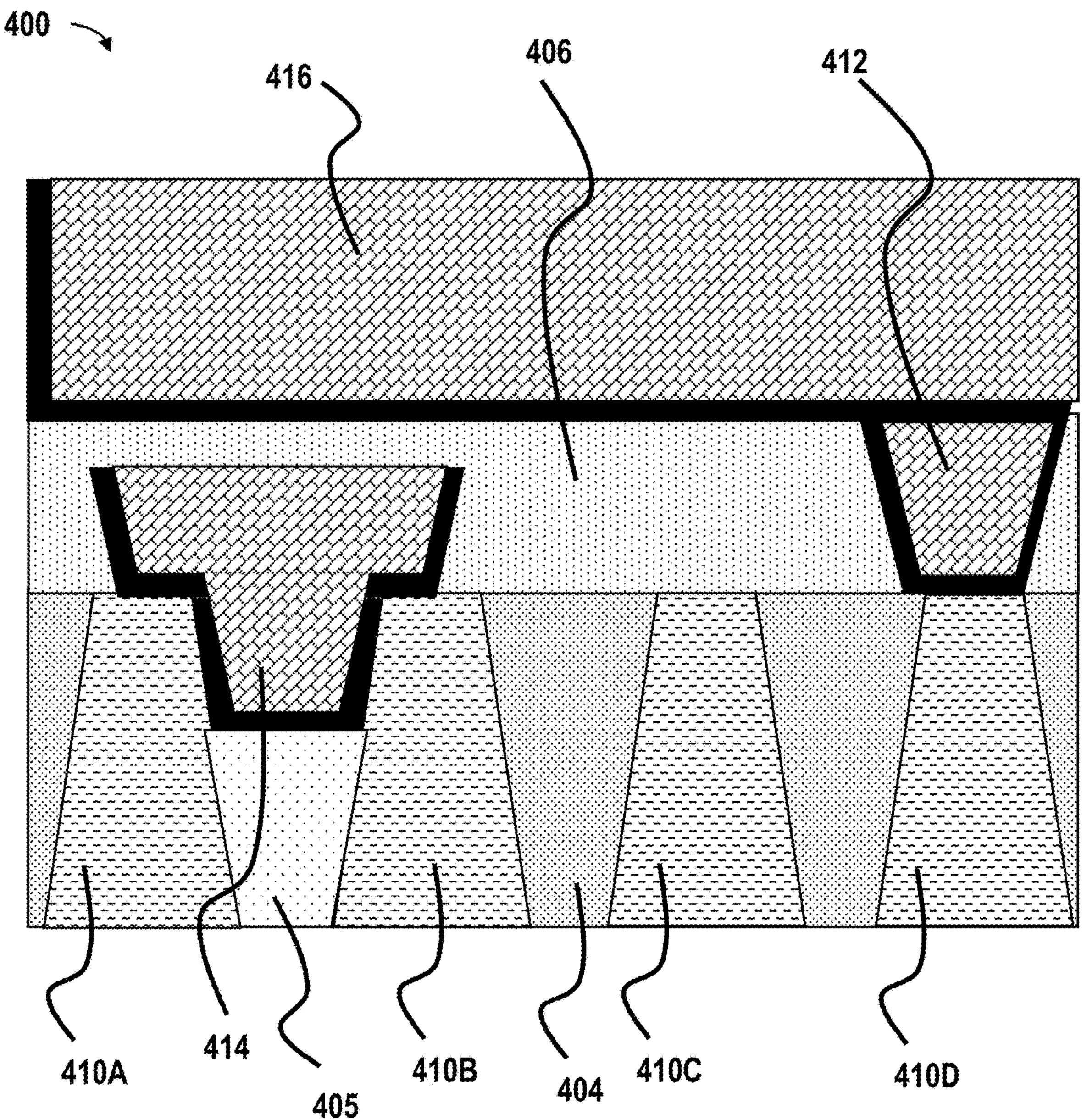
FIG. 4 illustrates a side cross-sectional view of an example interconnect structure, according to various embodiments of the present disclosure.

FIG. 4 depicts a side cross-sectional view of interconnect structure 400. In some embodiments, interconnect structure 400 may be fabricated using a combination of subtractive and damascene methods of processing.

FIG. 4 depicts dielectric 402 with metal lines 410A-D (e.g., 410A, 410B 410C, and 410D) as a basis for structure 400. In some embodiments, dielectric 402 and metal lines 410A-D may have been fabricated using a subtractive process. In some embodiments, the dielectric (deposited in the same process as dielectric 404) in an area between metal lines 410A and 410B may have been etched away. In some embodiments, a majority of the dielectric has been removed and dielectric 405 is deposited to a partial height of line 410A-B. In some embodiments, a partial etch is performed and dielectric 405 is the remainder left after the process was halted.

In some embodiments, the lower portion of metal jumper 414 may be deposited in the recess above dielectric 405. In some instances, the remainder of metal jumper 414, metal via 412, dielectric 406, and metal line 416 may be fabricated as corresponding components in FIG. 1A-F and FIG. 2A-J.

Figure 5:
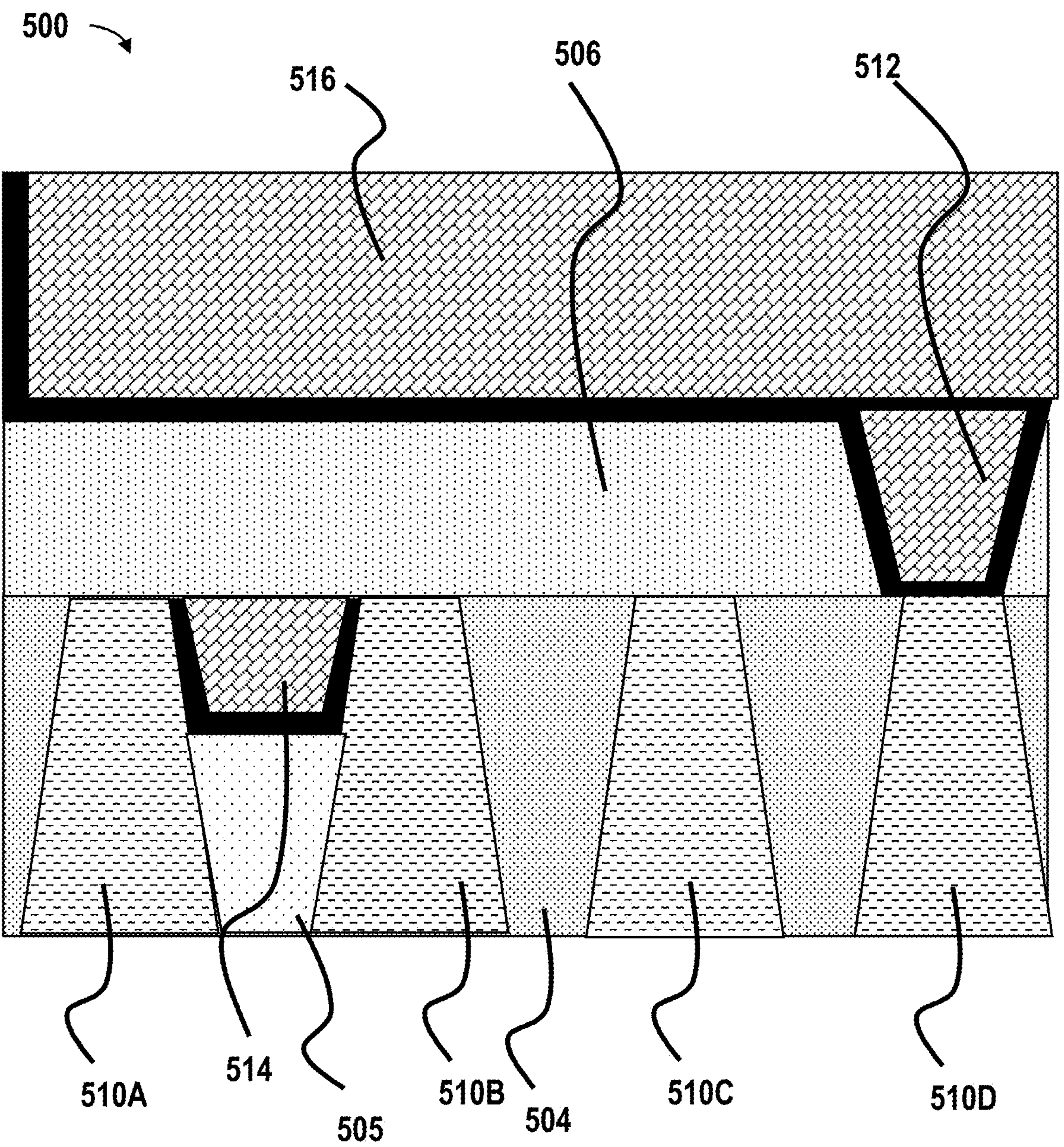
FIG. 5 illustrates a side cross-sectional view of an example interconnect structure, according to various embodiments of the present disclosure.

FIG. 5 depicts a side cross-sectional view of interconnect structure 500. In some embodiments, interconnect structure 500 may be fabricated using a combination of subtractive and damascene methods of processing.

FIG. 5 depicts dielectric 504 with metal lines 510A-D (e.g., 510A, 510B, 510C, and 510D) as a basis for structure 500. In some embodiments, dielectric 504 and metal lines 510A-D may have been fabricated using a subtractive process. In some embodiments, the dielectric (deposited in the same process as dielectric 504) in an area between metal lines 510A and 510B may have been etched away. In some embodiments, a majority of the dielectric has been removed and dielectric 505 is deposited to a partial height of line 510A-B. In some embodiments, a partial etch is performed and dielectric 505 is the remaining dielectric after the process was halted.

In some instances, the remainder of metal jumper 514, metal via 512, dielectric 506, and metal line 516 may be fabricated as corresponding components in FIG. 1A-F and FIG. 2A-J.

Figure 6:
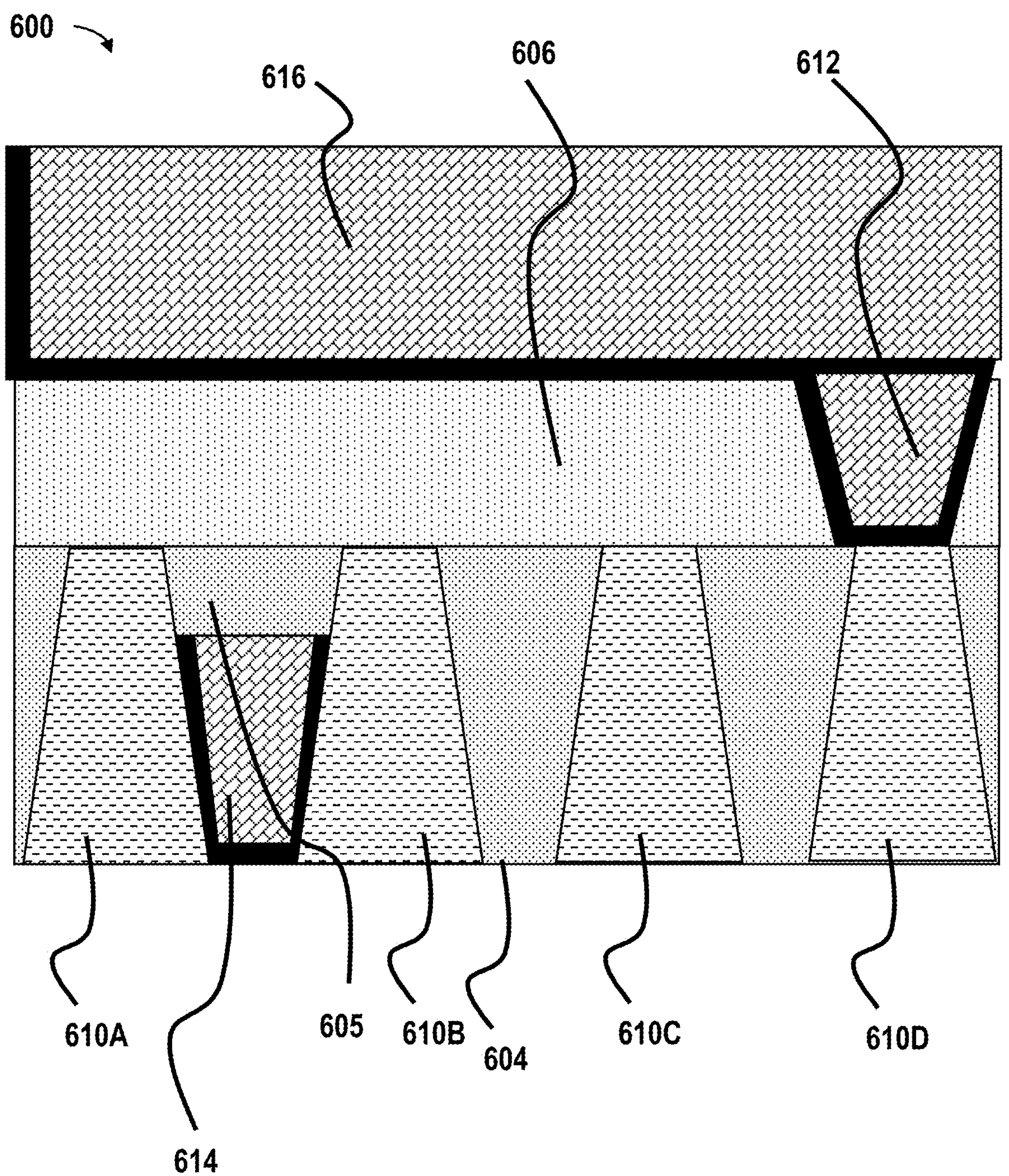
FIG. 6 illustrates a side cross-sectional view of an example interconnect structure, according to various embodiments of the present disclosure.

FIG. 6 depicts a side cross-sectional view of interconnect structure 600. In some embodiments, interconnect structure 600 may be fabricated using a combination of subtractive and damascene methods of processing.

FIG. 6 depicts dielectric 604 with metal lines 610A-D (e.g., 610A, 610B, 610C, and 610D) as a basis for structure 600. In some embodiments, dielectric 604 and metal lines 610A-D may have been fabricated using a subtractive process. In some embodiments, the dielectric (deposited in the same process as dielectric 604) in an area between metal lines 610A and 610B may have been etched away. In some embodiments, a majority of the dielectric is removed.

In some embodiments, metal jumper 614 is deposited in the recess left by the removal of the dielectric. In some embodiments, metal jumper 614 is deposited only up to a specific height (e.g., 50-80% of the height of metal lines 610A-D. In some embodiments, the metal jumper 614 is deposited up to an approximate height of the metal lines 610A-D and a selective metal wet etch is performed to remove a portion of metal jumper 614 (e.g., 50-70%).

In some embodiments, dielectric 605 is deposited above metal jumper 614 to fill in the remaining space between metal line 610A and 610B.

In some instances, the remainder of metal jumper 614, metal via 612, dielectric 606, and metal line 616 may be fabricated as corresponding components in FIG. 1A-F, FIG. 2A-J, FIG. 4, FIG. 5, and/or FIG. 6.

Figure 7:
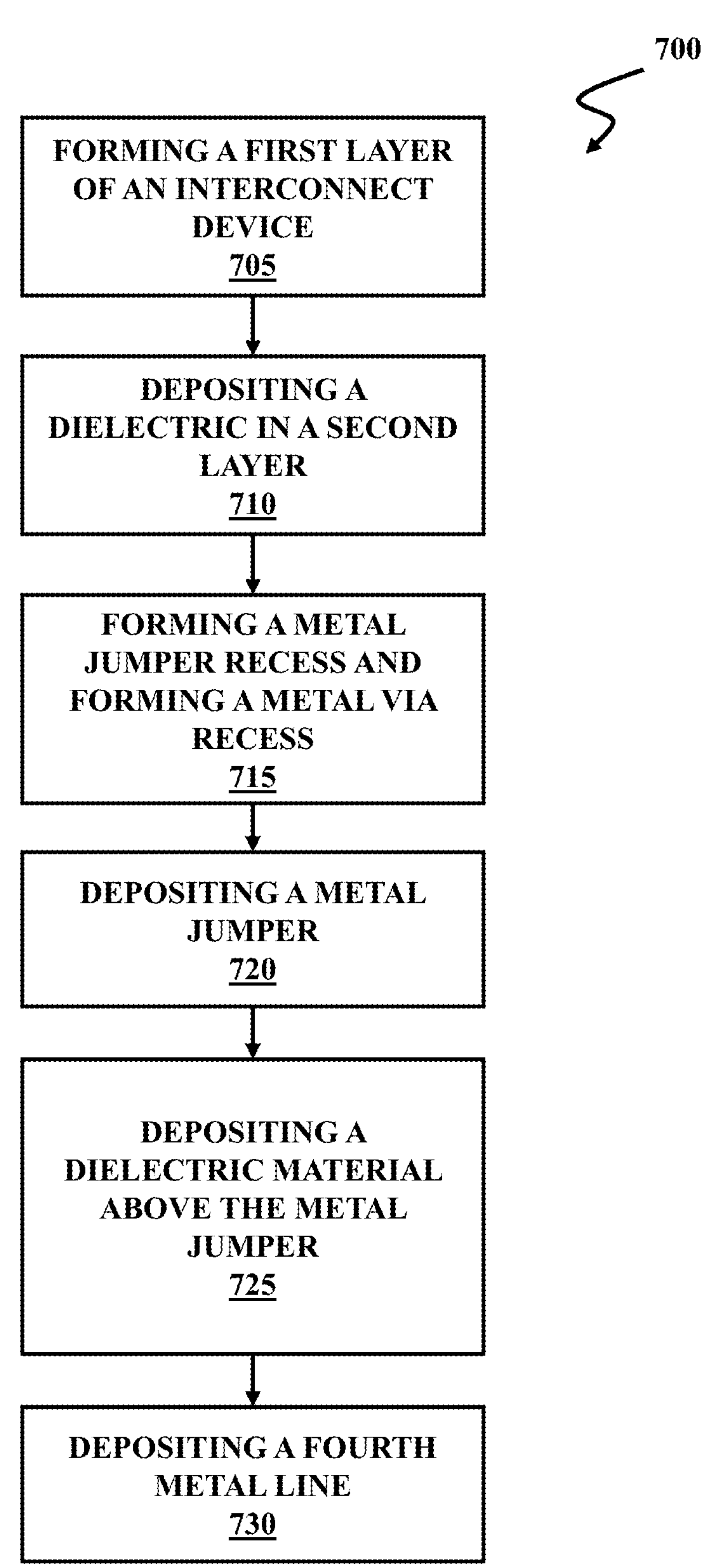
FIG. 7 illustrates an example method for fabricating a fly-over metal jumper in an interconnect structure, according to various embodiments of the present disclosure.

FIG. 7 depicts an example method 700 for fabricating a fly-over metal jumper in an interconnect structure.

Method 700 begins with operation 705 of forming a first layer of an interconnect device. In some embodiments, a first metal line, a second metal line, and a third metal line may be formed on and/or in a dielectric material. As will be understood by one skilled in the art, a variety of methods may be used to form the first layer of an interconnect device. In some embodiments, the first layer may be formed on a substrate.

Method 700 continues with operation 710 of depositing a dielectric in a second layer on top of the first layer. As described herein, a variety of methods may be used for depositing a dielectric material.

Method 700 continues with operation 715 of forming a metal jumper recess above the first metal line and the second metal line in the second layer, and forming a metal via recess above the third metal line in the second layer. In some embodiments, a recess may be formed with an etching process or another technique.

Method 700 continues with operation 720 of depositing a metal jumper in the metal jumper recess and a metal via in the metal via recess using a block mask process. In some embodiments, the block mask is modified part way through the deposition such that the metal via is deposited to the full height of the dielectric in the second layer and the metal jumper is only deposited to a fraction of the dielectric in the second layer. For example, the metal jumper may be deposited such that it reaches approximately 50% of the dielectric in the second layer and/or the metal via in the second layer. In some embodiments, the partial deposition of the metal jumper leaves an upper portion of the metal jumper recess open for a deposition of a dielectric material in operation 725 below.

Method 700 continues with operation 725 of depositing a dielectric material in an upper portion of the metal jumper recess above the metal jumper.

Method 700 continues with operation 730 of depositing a fourth metal line in a third layer above the second layer. In some embodiments, the fourth metal line may be deposited over the dielectric in the metal jumper recess and the metal via. In some embodiments, the fourth metal line is electrically and physically connected to the metal via. In some embodiments, the fourth metal line is electrically and physically isolated from the metal jumper by the dielectric in the upper portion of the metal jumper recess.

Figure 8:
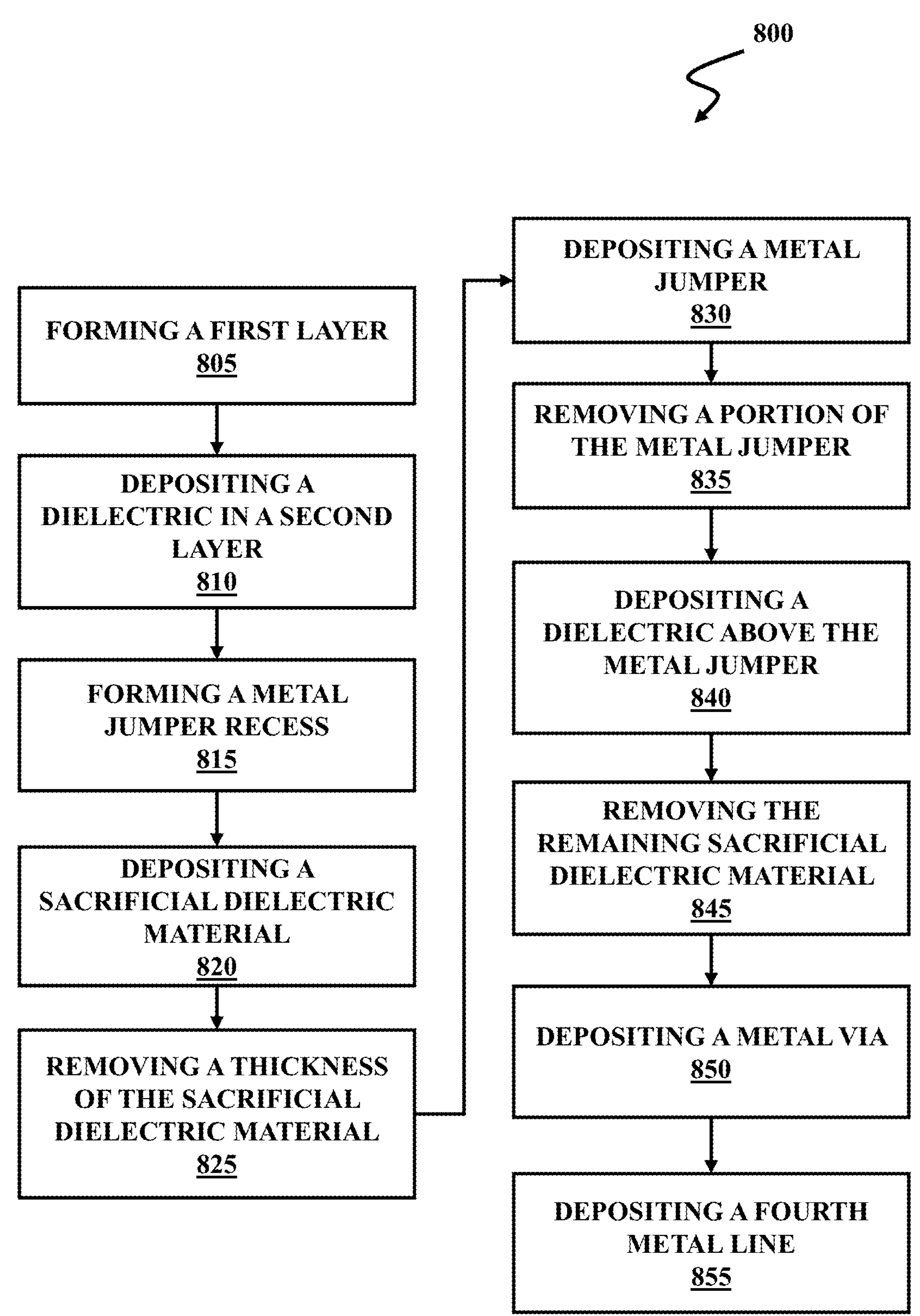
FIG. 8 illustrates an example method for fabricating a fly-over metal jumper in an interconnect structure, according to various embodiments of the present disclosure.

FIG. 8 depicts an example method 800 for fabricating a fly-over metal jumper in an interconnect structure.

Method 800 begins with operation 805 of forming a first layer of an interconnect device. In some embodiments, a first metal line, a second metal line, and a third metal line may be formed on and/or in a dielectric material. As will be understood by one skilled in the art, a variety of methods may be used to form the first layer of in interconnect device. In some embodiments, the first layer may be formed on a substrate.

Method 800 continues with operation 810 of depositing a dielectric in a second layer on top of the first layer. As described herein, a variety of methods may be used for depositing a dielectric material.

Method 800 continues with operation 815 of forming a metal jumper recess above the first metal line and the second metal line in the second layer and forming a metal via recess above the third metal line in the second layer. In some embodiments, a recess may be formed with an etching process or another technique.

Method 800 continues with operation 820 of depositing a sacrificial dielectric material on top of the second layer. In some embodiments, the sacrificial dielectric material is evenly deposited on the uneven surface of the second layer, thereby forming a pinch-off region in the metal via recess. For example, the deposition thickness of the sacrificial dielectric is made to be more than half the diameter of the metal via recess, such that the metal via is completely filled with the sacrificial dielectric material. Conversely, in this example, the metal jumper recess is significantly larger than the metal via recess such that the metal jumper recess will not be entirely filled with the sacrificial dielectric material.

Method 800 continues with operation 825 of removing a thickness of the sacrificial dielectric material. In some embodiments, by removing a specific thickness (e.g., approximately the deposition thickness) of the dielectric material all of the sacrificial dielectric material from the metal jumper recess is removed, but the sacrificial dielectric material in the metal via recess remains (see FIG. 2D-E). In some embodiments, the removal is performed by etching the surface until the desired depth is achieved. In this example, the desired depth would be removing the sacrificial dielectric everywhere but the via.

Method 800 continues with operation 830 of depositing a metal jumper in the metal jumper recess.

Method 800 continues with operation 835 of removing a portion of the metal jumper leaving a void above the metal jumper in the metal jumper recess.

Method 800 continues with operation 840 of depositing a dielectric material in the void in the metal jumper recess above the metal jumper. In some embodiments, the dielectric material is deposited to approximately the height of the void.

Method 800 continues with operation 845 of removing the remaining sacrificial dielectric material from the metal via recess.

Method 800 continues with operation 850 of depositing a metal via in the metal via recess to create a metal via.

Method 800 continues with operation 855 of depositing a fourth metal line in a third layer over the second layer. In some embodiments, the fourth metal line is electrically and physically connected to the metal via and, the fourth metal line is electrically and physically isolated from the metal jumper.

Figure 9:
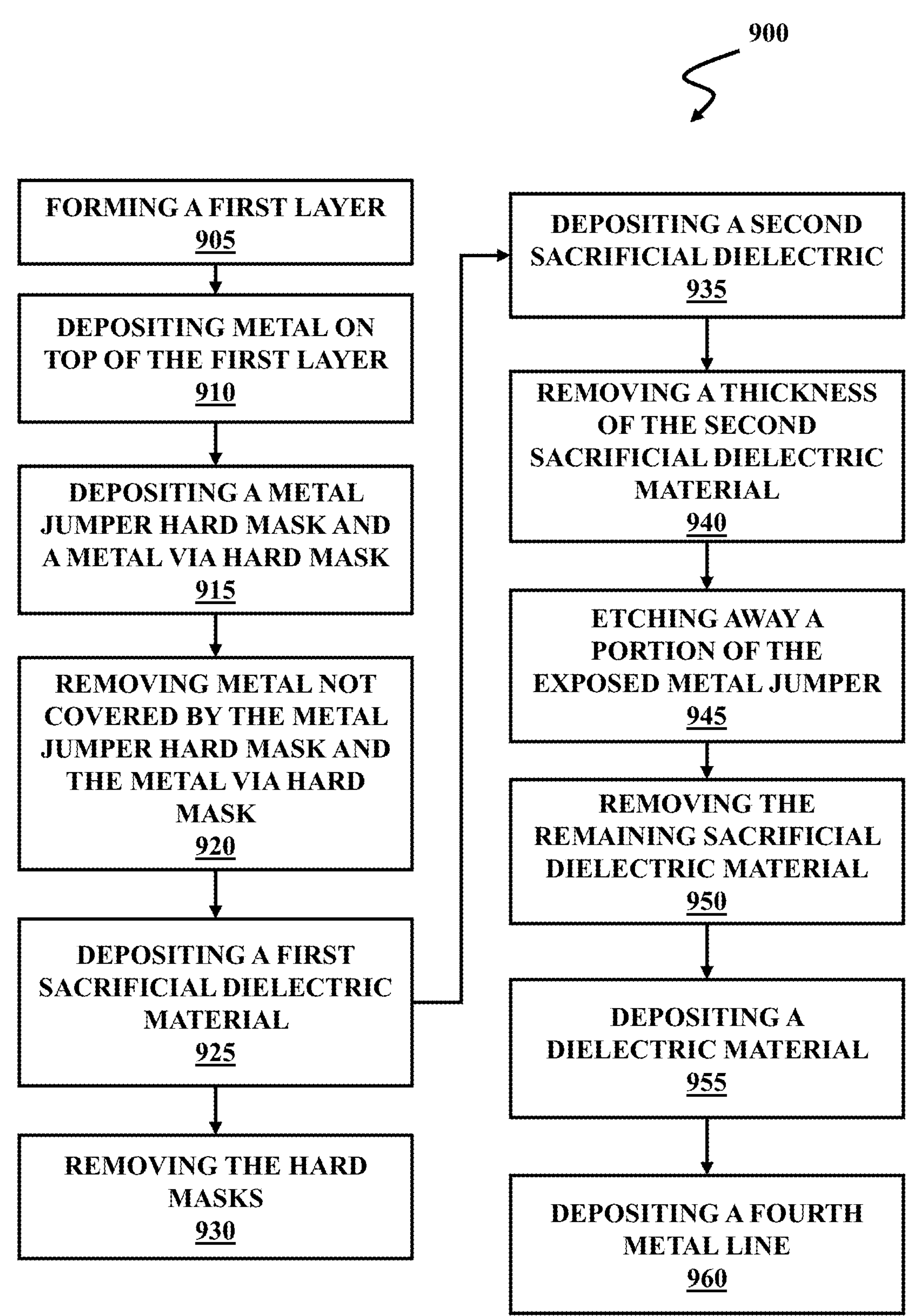
FIG. 9 illustrates an example method for fabricating a fly-over metal jumper in an interconnect structure, according to various embodiments of the present disclosure.

FIG. 9 depicts an example method 900 for fabricating a fly-over metal jumper in an interconnect structure.

Method 900 begins with operation 905 of forming a first layer of an interconnect device. In some embodiments, a first metal line, a second metal line, and a third metal line may be formed on and/or in a dielectric material. As will be understood by one skilled in the art, a variety of methods may be used to form the first layer of in interconnect device. In some embodiments, the first layer may be formed on a substrate.

Method 900 continues with operation 910 of depositing metal in a second layer on top of the first layer. As described herein, a variety of methods may be used for depositing a metal material.

Method 900 continues with operation 915 of depositing a metal jumper hard mask and a metal via hard mask. In some embodiments, the metal jumper hard mask is deposited over a position of the first metal line and the second metal line and a metal via hard mask over a position of the third metal line (the metal layer is between the hard masks and the lines).

Method 900 continues with operation 920 of removing metal from the second layer that is not covered by the metal jumper hard mask and the metal via hard mask. In some embodiments, an etching process may be used to remove the metal, and the hard masks protect the metal the hard masks cover from being etched. Operation 920 creates a metal jumper under the metal jumper hard mask and a metal via under the metal via hard mask.

Method 900 continues with operation 925 of depositing a first sacrificial dielectric material around the metal jumper, the metal via, and the hard masks. The first sacrificial dielectric material deposited in operation 925, the metal jumper, the metal via, and the hard masks will be considered to reside in the second layer.

Method 900 continues with operation 930 of removing the hard masks. In some embodiments, as described herein, the hard masks may be removed with a selective etching process.

Method 900 continues with operation 935 of depositing a second sacrificial dielectric over the second layer forming a pinch-off region in the metal via recess above the metal via. In some embodiments, the second sacrificial dielectric material is evenly deposited on the uneven surface of the second layer, thereby forming a pinch-off region in the metal via recess. For example, the deposition thickness of the second sacrificial dielectric is made to be more than half the diameter of the metal via recess, such that the metal via is filled with the second sacrificial dielectric material. Conversely, in this example, the metal jumper recess is significantly larger than the metal via recess such that the metal jumper recess will not be entirely filled up with the second sacrificial dielectric material.

Method 900 continues with operation 940 of removing a thickness of the second sacrificial dielectric material. In some embodiments, by removing a specific thickness (e.g., approximately the deposition thickness) of the dielectric material all of the second sacrificial dielectric material from the metal jumper recess is removed, but the second sacrificial dielectric material in the metal via recess remains (see FIG. 3E-F). In some embodiments, operation 940 is a selective removal (e.g., etching) process that selectively removes the second sacrificial dielectric, but not the first sacrificial dielectric.

Method 900 continues with operation 945 of etching away a portion of the exposed metal jumper. In some embodiments, the etching process is performed long enough to remove a portion of the metal jumper and then the etching process is stopped leaving a thickness (e.g., approximately 50% of the original thickness).

Method 900 continues with operation 950 of removing the remaining first sacrificial dielectric material and the second sacrificial dielectric material. In some embodiments, operation 950 is a selective removal process that removes the sacrificial dielectric material but not other dielectric material. In some instances, different etchants may be used to remove each sacrificial material.

Method 900 continues with operation 955 of depositing a dielectric material in the second layer over the metal jumper and up to the level of the metal via.

Method 900 continues with operation 960 of depositing a fourth metal line over the second layer. In some embodiments, the fourth metal line may be electrically/physically connected to the metal via and electrically/physically isolated from the metal jumper.

The flowchart and block diagrams in the Figures illustrate the architecture, functionality, and operation of possible implementations of systems, methods, and computer program products according to various embodiments of the present invention. In this regard, each block in the flowchart or block diagrams may represent a module, segment, or portion of instructions, which comprises one or more executable instructions for implementing the specified logical function(s). In some alternative implementations, the functions noted in the blocks may occur out of the order noted in the Figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts or carry out combinations of special purpose hardware and computer instructions.

The descriptions of the various embodiments of the present disclosure have been presented for purposes of illustration but are not intended to be exhaustive or limited to the embodiments disclosed. Many modifications and variations will be apparent to those of ordinary skill in the art without departing from the scope and spirit of the described embodiments. The terminology used herein was chosen to explain the principles of the embodiments, the practical application or technical improvement over technologies found in the marketplace, or to enable others of ordinary skill in the art to understand the embodiments disclosed herein.

What is claimed is:

1. An interconnect structure comprising:

a first layer with a first metal line, a second metal line, and a third metal line;

a second layer with a metal jumper and a metal via, wherein the metal jumper is electrically connected to the first metal line and the second metal line, wherein the metal via is electrically connected to the second metal line, and wherein the metal jumper and the metal via are electrically isolated; and a third layer with a fourth metal line above the jumper and the via, wherein the metal jumper is electrically isolated from the third metal line by a first dielectric region between the metal jumper and the third metal line.

2. The structure of claim 1, wherein the metal jumper is formed in a lower portion of a first recess, and wherein a semiconductor material physically isolates the metal jumper from the second metal layer.

3. The structure of claim 1, wherein the jumper extends below the top of the first metal line and the second metal line.

4. The structure of claim 1, wherein the metal jumper and the metal via are formed in the deposition process, and wherein the metal jumper is partially etched away.

5. The structure of claim 1, wherein the metal jumper and the metal via are formed using a block mask deposition process.

6. The structure of claim 1, wherein the metal jumper is formed after a sacrificial dielectric deposition layer is fill a metal via recess.

7. The structure of claim 1, wherein the metal via is deposited with a process selected from a group consisting of: single damascene, and dual damascene.

* * * * *